(12) United States Patent
Morozumi et al.

(10) Patent No.: US 11,889,699 B2
(45) Date of Patent: Jan. 30, 2024

(54) SEMICONDUCTOR MEMORY DEVICE WITH A PLURALITY OF SENSE AMPILIFERS OVERLAPPING A PLURALITY OF METAL JOINTS

(71) Applicant: Kioxia Corporation, Tokyo (JP)

(72) Inventors: Naohito Morozumi, Kawasaki Kanagawa (JP); Hiroshi Maejima, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/100,615

(22) Filed: Jan. 24, 2023

(65) Prior Publication Data

US 2023/0165010 A1  May 25, 2023

Related U.S. Application Data

(62) Division of application No. 16/795,763, filed on Feb. 20, 2020, now Pat. No. 11,594,546.

(30) Foreign Application Priority Data

Apr. 17, 2019  (JP) ................................. 2019-078649

(51) Int. Cl.
*H10B 43/40* (2023.01)
*G11C 16/16* (2006.01)
(Continued)

(52) U.S. Cl.
CPC ............. *H10B 43/40* (2023.02); *G11C 5/025* (2013.01); *G11C 7/06* (2013.01); *G11C 16/08* (2013.01);
(Continued)

(58) Field of Classification Search
CPC ........ H10B 43/40; H10B 43/10; H10B 43/35; H10B 43/27; G11C 5/025; G11C 7/06;
(Continued)

(56) References Cited

U.S. PATENT DOCUMENTS 9,612,615 B2  4/2017  Lin et al.
10,186,323 B2  1/2019  Maejima
(Continued)

FOREIGN PATENT DOCUMENTS

JP  2018045749 A  3/2018

OTHER PUBLICATIONS

Notice of Allowance dated Nov. 17, 2022, issued in parent U.S. Appl. No. 16/795,763.
(Continued)

*Primary Examiner* — Jerome Leboeuf
(74) *Attorney, Agent, or Firm* — Holtz, Holtz & Volek PC

(57) ABSTRACT

A semiconductor memory device including a substrate having a first region and a second region; a plurality of first transistors provided in the first region; a plurality of second transistors provided in the second region, the plurality of second transistors being electrically coupled to the plurality of first transistors, respectively, and a breakdown-voltage of the second transistor being lower than a breakdown-voltage of the first transistor. A plurality of joint metals are provided above the first region, the plurality of joint metals being electrically coupled to the plurality of first transistors, respectively. A plurality of bit lines are provided in an upper layer of the plurality of joint metals, the plurality of bit lines being coupled to the plurality of joint metals, respectively; and a plurality of memory cells are provided in an upper layer of the plurality of bit lines, the plurality of memory cells being coupled to the plurality of bit lines, respectively.

13 Claims, 21 Drawing Sheets

(51) Int. Cl.
  *G11C 16/26* (2006.01)
  *G11C 16/08* (2006.01)
  *G11C 16/24* (2006.01)
  *H01L 23/00* (2006.01)
  *G11C 7/06* (2006.01)
  *H10B 43/10* (2023.01)
  *H10B 43/35* (2023.01)
  *G11C 5/02* (2006.01)

(52) U.S. Cl.
  CPC .............. *G11C 16/16* (2013.01); *G11C 16/24* (2013.01); *G11C 16/26* (2013.01); *H01L 24/05* (2013.01); *H01L 24/20* (2013.01); *H10B 43/10* (2023.02); *H10B 43/35* (2023.02); *H01L 2924/1438* (2013.01)

(58) Field of Classification Search
  CPC ......... G11C 16/08; G11C 16/16; G11C 16/24; G11C 16/26; G11C 5/063; G11C 16/0483; G11C 16/32; G11C 16/10; G11C 5/02; H01L 24/05; H01L 24/20; H01L 2924/1438; H01L 24/08; H01L 2224/05554; H01L 2224/05647; H01L 2224/08145; H01L 2224/09517
  See application file for complete search history.

(56) References Cited

U.S. PATENT DOCUMENTS

| | | |
|---|---|---|
| 2005/0179078 A1 | 8/2005 | Lee |
| 2012/0106282 A1* | 5/2012 | Shikata .................. H01L 24/05 257/773 |
| 2014/0003149 A1* | 1/2014 | Maejima ............. H01L 23/5226 365/51 |
| 2017/0287889 A1 | 10/2017 | Kawasaki et al. |
| 2018/0293029 A1 | 10/2018 | Achtenberg et al. |
| 2019/0363129 A1* | 11/2019 | Yokoyama .......... H01L 25/0657 |

OTHER PUBLICATIONS

U.S. Appl. No. 16/804,037; First Named Inventor: Hiroshi Maejima; Title: "Memory System, Memory Controller, and Semiconductor Memory Device"; Filed: Feb. 28, 2020.

* cited by examiner

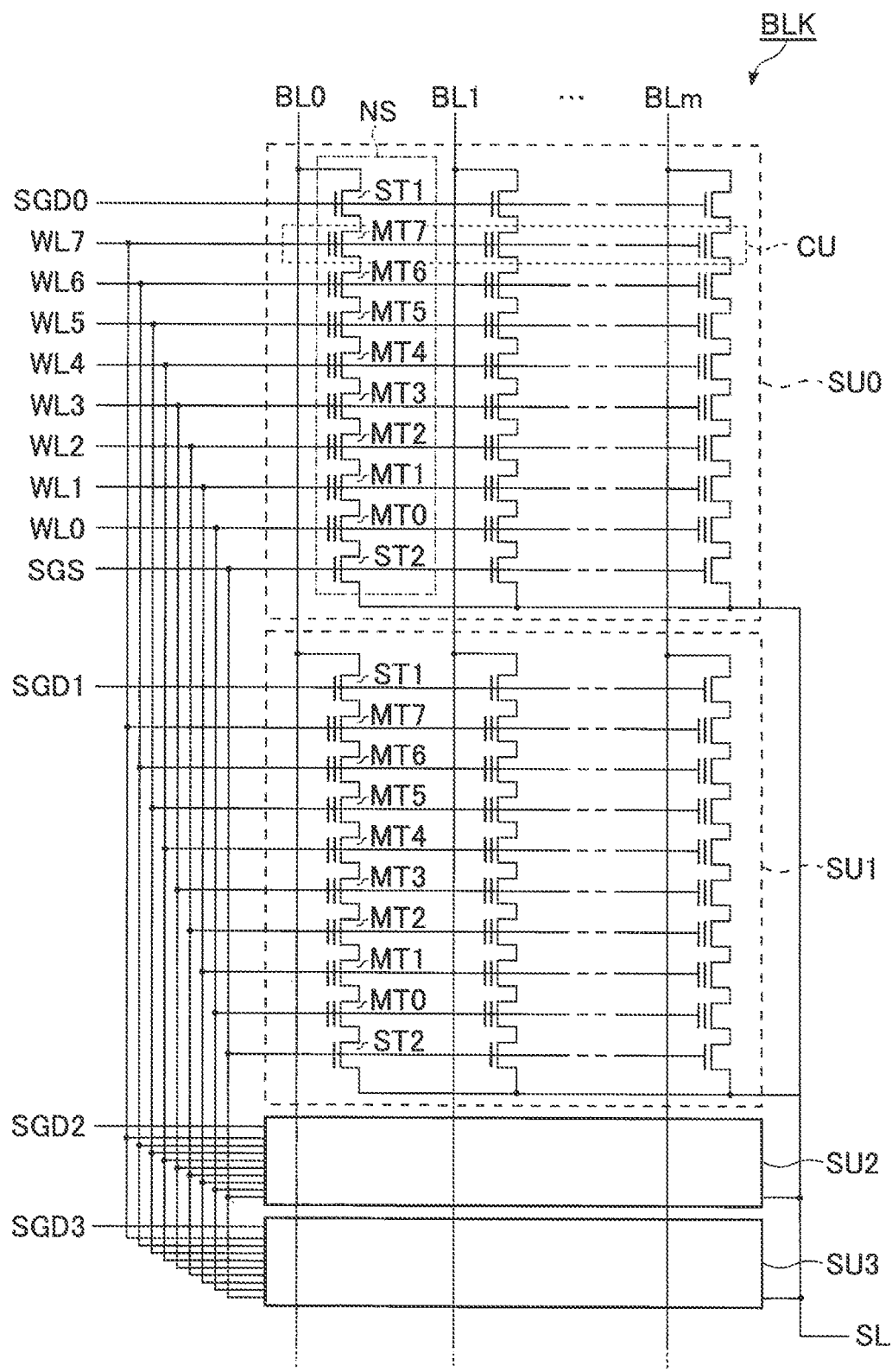
F I G. 2

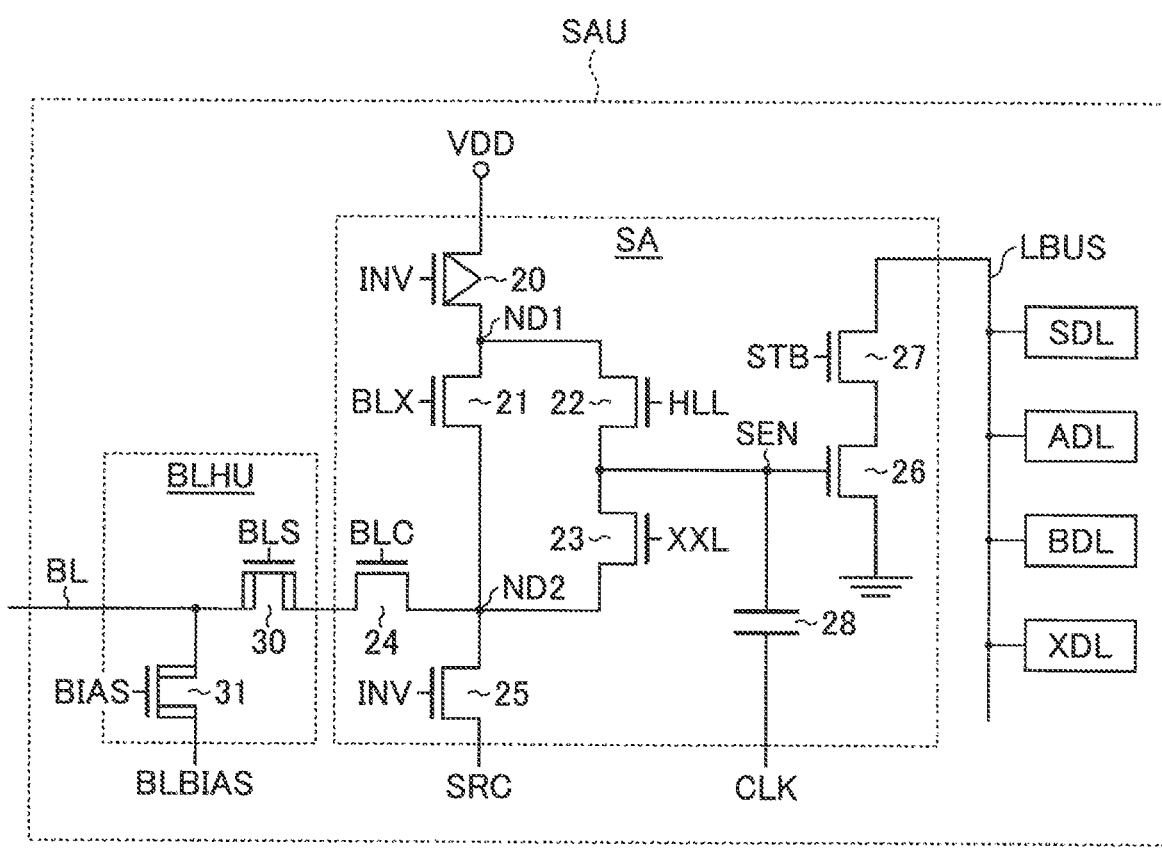
F I G. 4

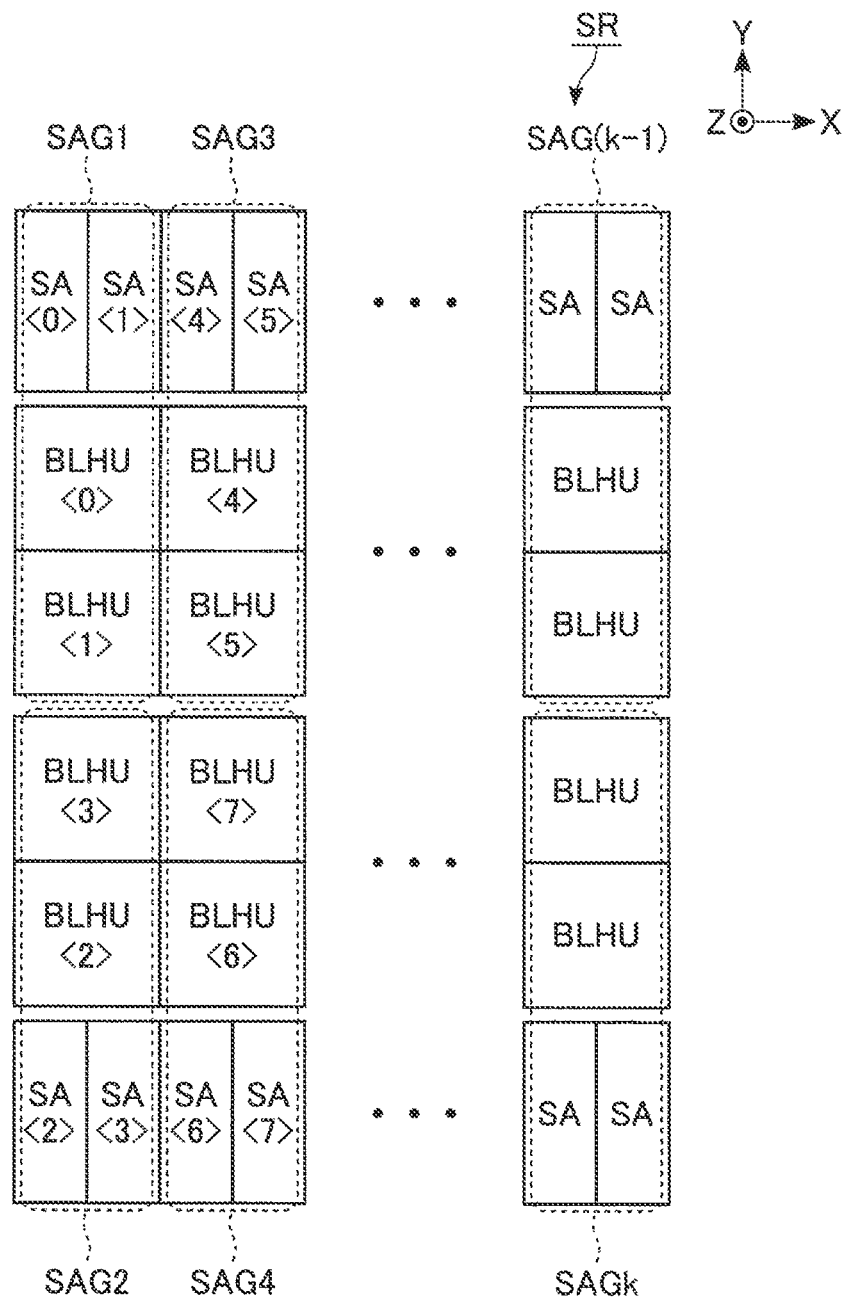
F I G. 9

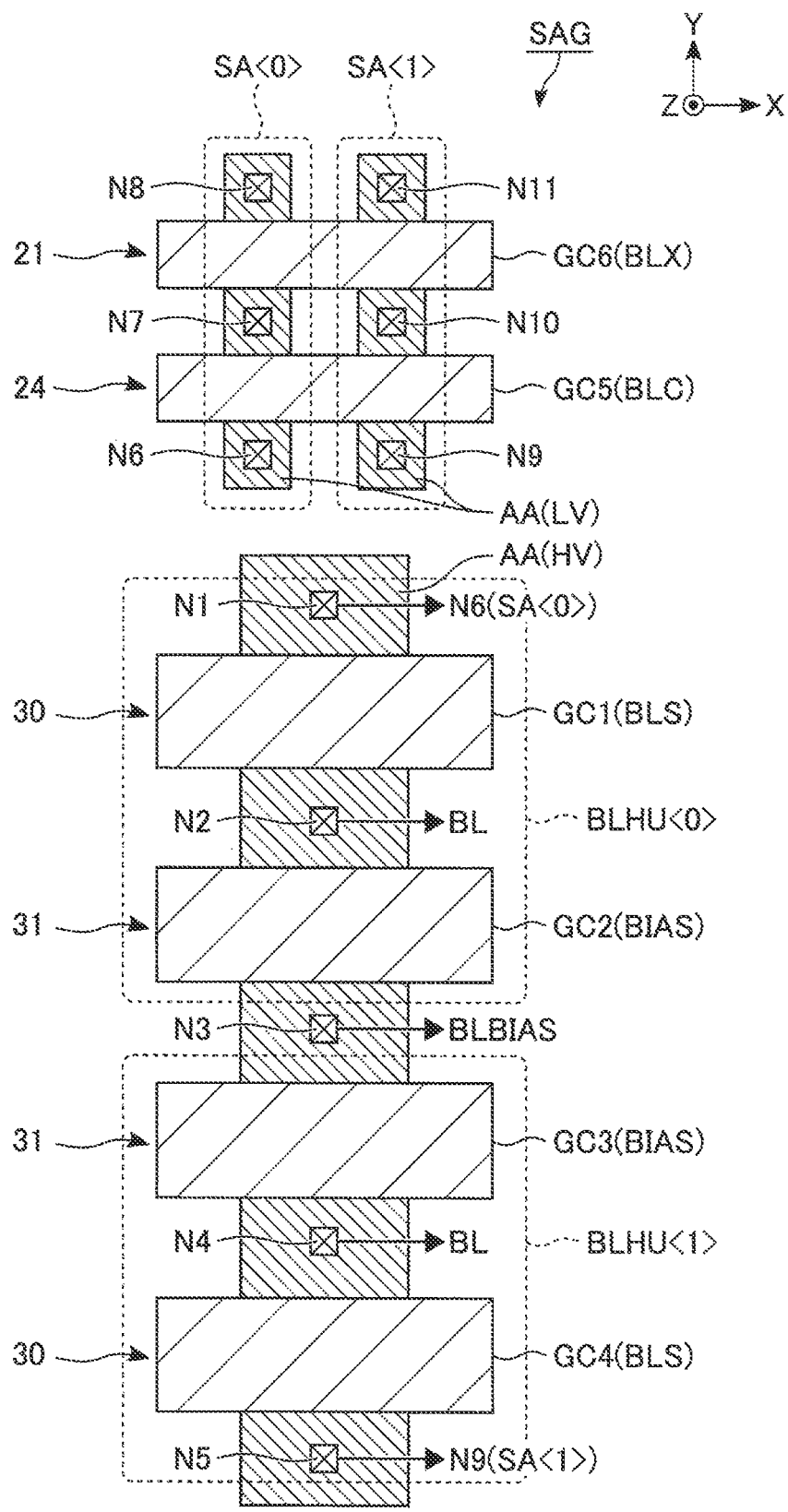
F I G. 10

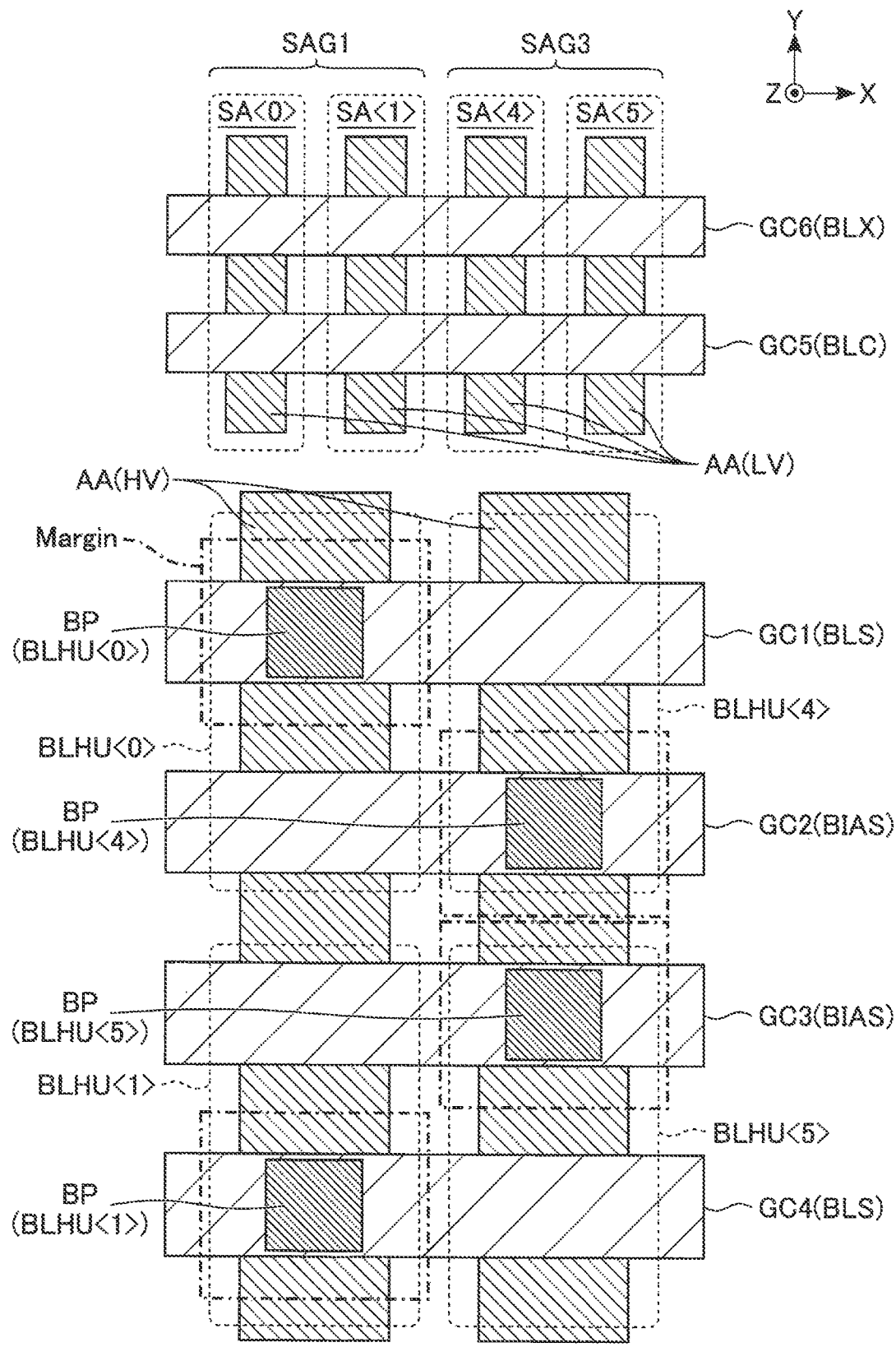
F I G. 12

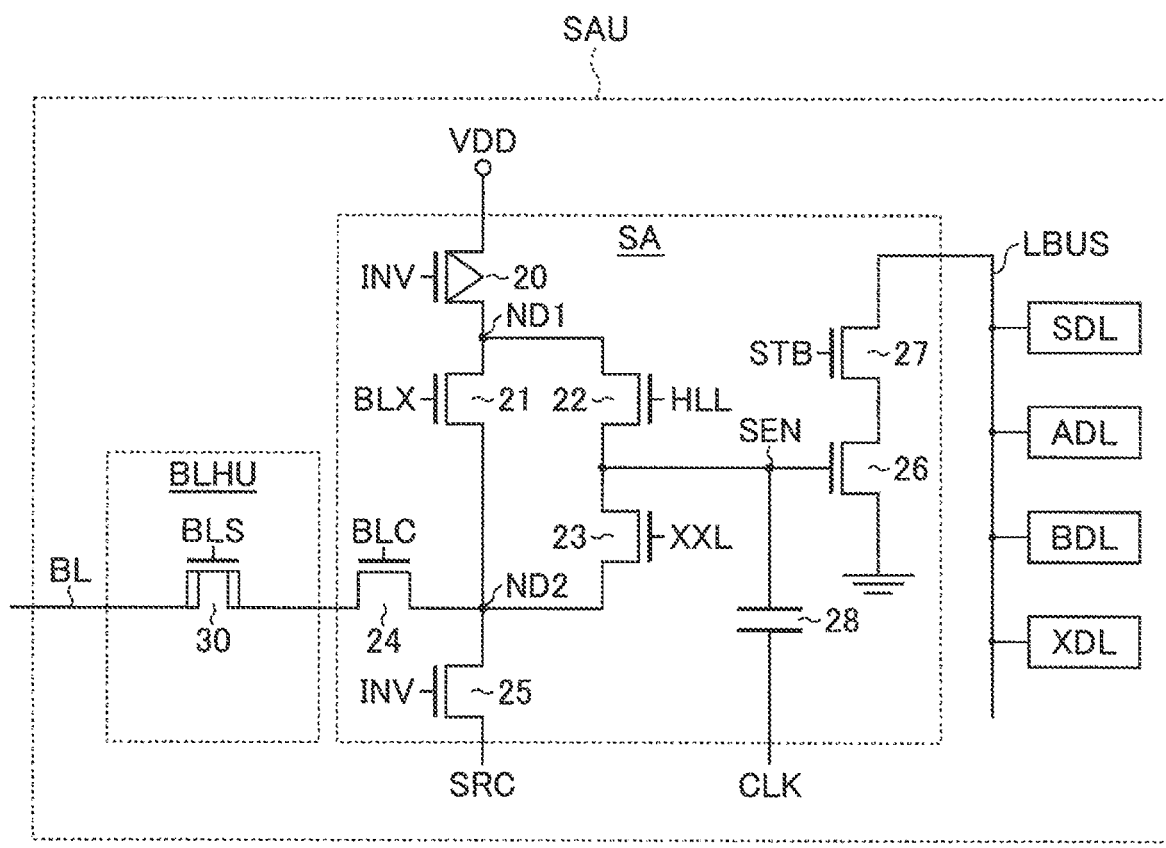
F I G. 17

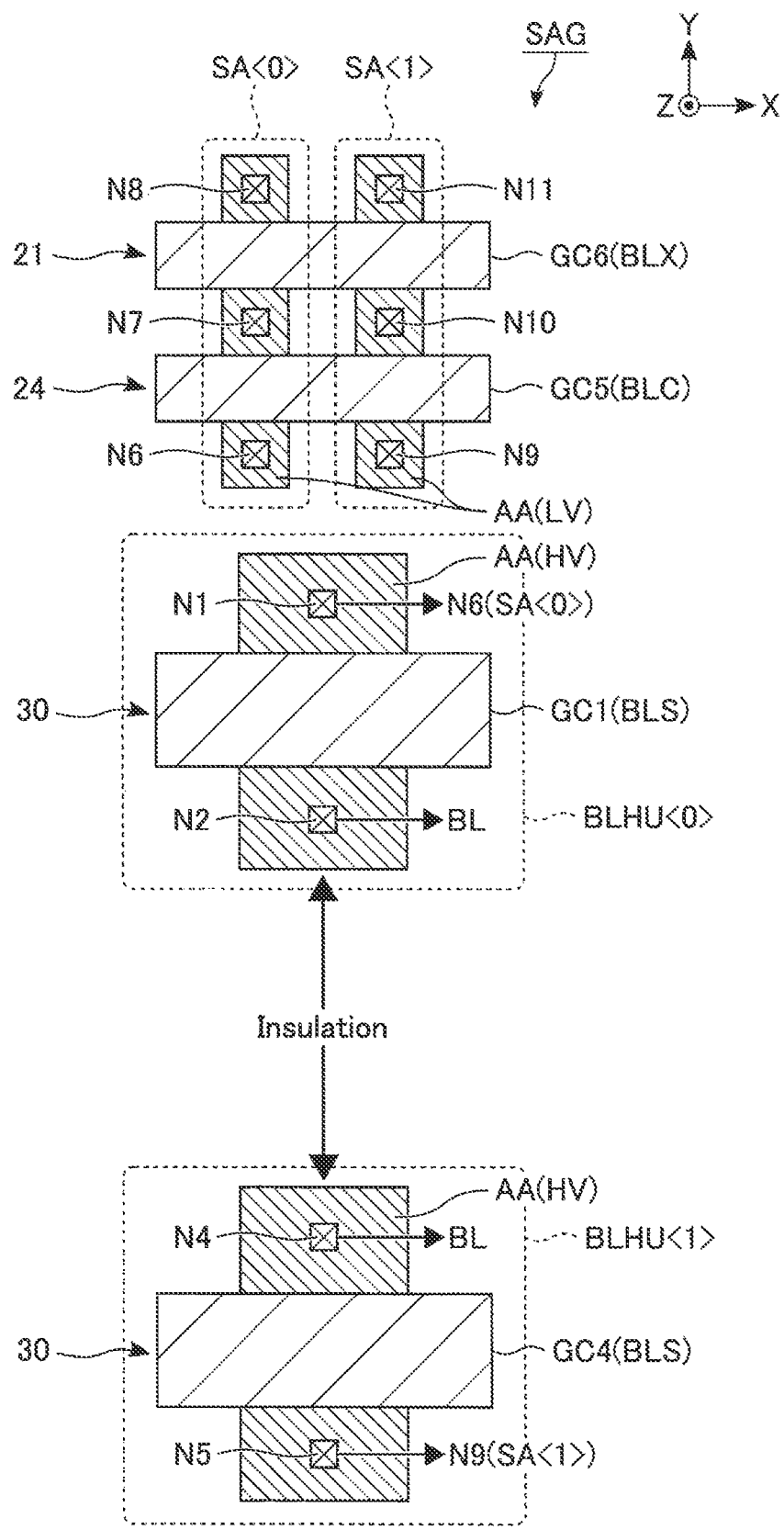
F I G. 18

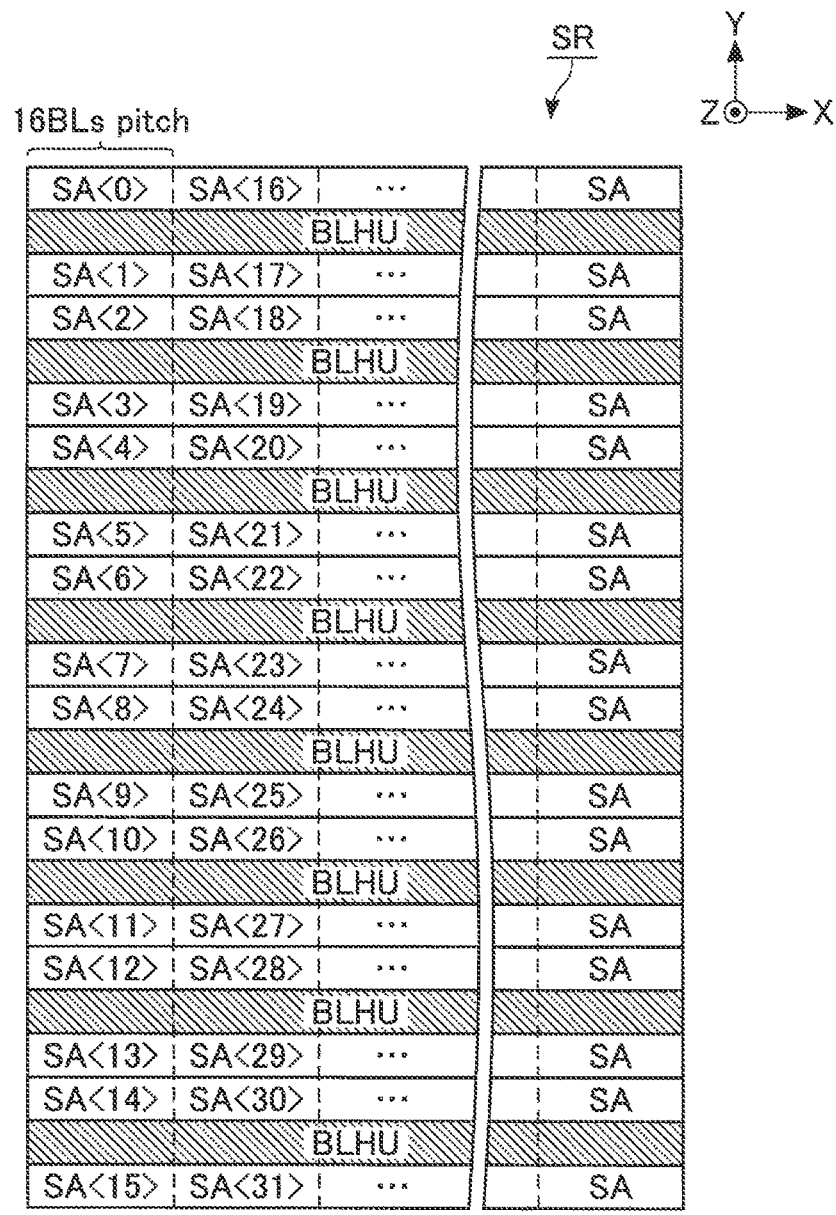
F I G. 21

SEMICONDUCTOR MEMORY DEVICE WITH A PLURALITY OF SENSE AMPILIFERS OVERLAPPING A PLURALITY OF METAL JOINTS

CROSS-REFERENCE TO RELATED APPLICATIONS

This application is a Divisional Application of U.S. application Ser. No. 16/795,763, filed Feb. 20, 2020, which is based upon and claims the benefit of priority from Japanese Patent Application No. 2019-078649, filed Apr. 17, 2019, the entire contents of all of which are incorporated herein by reference.

FIELD

Embodiments described herein relate to generally a semiconductor memory device.

BACKGROUND

There is known a NAND-type flash memory that is capable of storing data in a nonvolatile manner.

BRIEF DESCRIPTION OF THE DRAWINGS

FIG. 2 is a circuit diagram showing an example of a circuit configuration of a memory cell array included in the semiconductor memory device according to the first embodiment.

FIG. 4 is a circuit diagram showing an example of a circuit configuration of a sense amplifier unit in the semiconductor memory device according to the first embodiment.

FIG. 9 is a plan view showing an example of a planar layout in a sense amplifier region of the semiconductor memory device according to the first embodiment.

FIG. 10 is a plan view showing an example of a planar layout of a sense amplifier group in the semiconductor memory device according to the first embodiment.

FIG. 12 is a plan view showing an example of a planar layout of a bonding pad, an active region, and a gate line in the sense amplifier region of the semiconductor memory device according to the first embodiment.

FIG. 17 is a circuit diagram showing an example of a circuit configuration of a sense amplifier unit in a semiconductor memory device according to a second embodiment.

FIG. 18 is a plan view showing an example of a planar layout of a sense amplifier group in the semiconductor memory device according to the second embodiment.

FIG. 21 is a plan view showing an example of a planar layout in a sense amplifier region of a semiconductor memory device according to a third embodiment.

DETAILED DESCRIPTION

In general, according to one embodiment, a semiconductor memory device includes a memory chip and a circuit chip. The memory chip includes first and second memory cells, first and second bit lines electrically coupled to one end of each of the first and the second memory cells, respectively, and first and second joint metals electrically coupled to the first and second bit lines, respectively. The circuit chip includes a substrate, first and second sense amplifiers provided on the substrate, and third and fourth joint metals electrically coupled to the first and second sense amplifiers, respectively, and facing the first and second joint metals, respectively. The circuit chip and the memory chip are joined. The first and second joint metals are electrically coupled to the third and fourth joint metals, respectively. The first sense amplifier includes a first active region and a second active region which is different from the first active region. The first active region is provided with a first transistor that is electrically coupled between the third joint metal and the second active region. The second amplifier includes a third active region that is adjacent to the first active region in a first direction, a fourth active region that is adjacent to the second active region in a second direction intersecting with the first direction, and that differs from the third active region. The third active region is provided with a second transistor that is electrically coupled between the fourth joint metal and the fourth active region. In a planar view, the third and fourth joint metals overlap the first and third active regions, respectively.

Hereinafter, embodiments will be described with reference to the drawings. Each embodiment describes, as an example, a device or a method for embodying the technical idea of the invention. It should be noted that the drawings are schematic or conceptual, and that the dimensions and scale of each drawing are not necessarily the same as those of the actual products. The technical idea of the present invention is not specified by the shape, structure, arrangement, etc. of structural elements.

In the following description, structural elements having substantially the same function and configuration will be assigned with the same reference symbol. A numeral following letters constituting a reference symbol is used for distinction between elements referred to by reference symbols including the same letters and having the same configuration. If elements represented by reference symbols including the same letters need not be distinguished from one another, those elements will be assigned with reference symbols including only the same letters.

[1] First Embodiment

Hereinafter, a semiconductor memory device 1 according to a first embodiment will be explained.

[1-1] Configuration of Semiconductor Memory Device 1

[1-1-1] Overall Configuration of Semiconductor Memory Device 1

Figure 1:
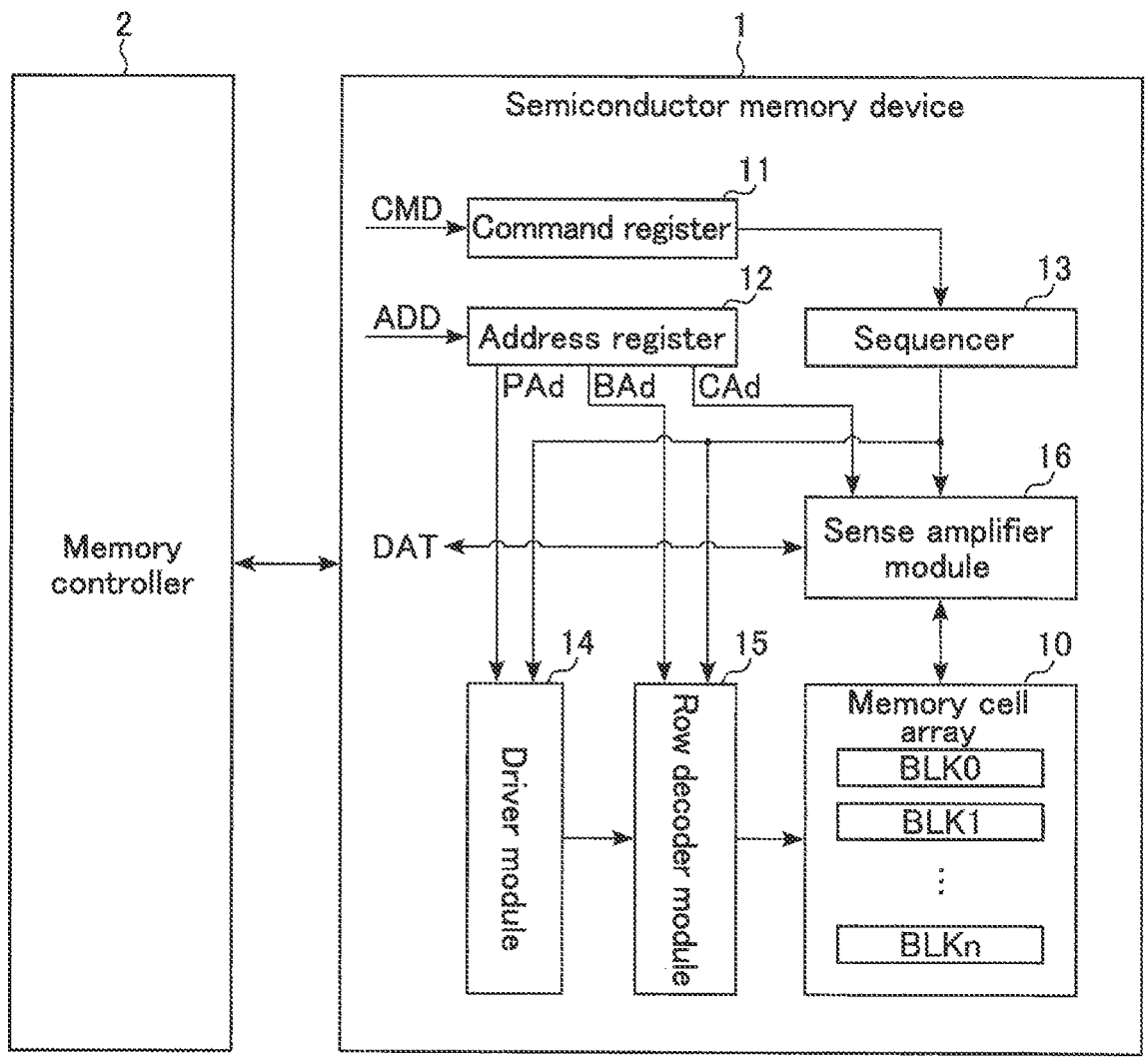
FIG. 1 is a block diagram showing a configuration example of a semiconductor memory device according to a first embodiment.

FIG. 1 shows a configuration example of the semiconductor memory device 1 according to the first embodiment. The semiconductor memory device 1 is a NAND-type flash memory that is capable of storing data in a non-volatile manner, and is controlled by an external memory controller 2. Communication between the semiconductor memory device 1 and the memory controller 2 supports, for example, a NAND interface standard.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer equal to or greater than 1). A block BLK is a group of a plurality of memory cells capable of storing data in a non-volatile manner, and is used as, for example, a data erasure unit. In the memory cell array 10, a plurality of bit lines and a plurality of word lines are provided. Each memory cell is associated with, for example, one bit line and one word line. A detailed configuration of the memory cell array 10 will be described later.

The command register 11 holds a command CMD received by the semiconductor memory device 1 from the memory controller 2. The command CMD includes an instruction to cause the sequencer 13 to perform, for example, a read operation, a write operation, and an erase operation.

The address register 12 holds address information ADD received by the semiconductor memory device 1 from the memory controller 2. The address information ADD includes, for example, a block address BAd, a page address PAd, and a column address CAd. For example, the block address BAd, the page address PAd, and the column address CAd are used for selecting a block BLK, a word line, and a bit line, respectively.

The sequencer 13 controls the entire operation of the semiconductor memory device 1. For example, the sequencer 13 performs a read operation, a write operation, and an erase operation by controlling the driver module 14, the row decoder module 15, and the sense amplifier module 16, etc. based on the command CMD held in the command register 11.

The driver module 14 generates a voltage to be used in the read operation, the write operation, and the erase operation, etc. The driver module 14 applies the generated voltage to a signal line corresponding to the selected word line based on, for example, the page address PAd held in the address register 12.

Based on the block address BAd held in the address register 12, the row decoder module 15 selects a single corresponding block BLK in the memory cell array 10. Thereafter, the row decoder module 15 transfers, for example, the voltage applied to the signal line corresponding to the selected word line to the selected word line in the selected block BLK.

In the write operation, the sense amplifier module 16 applies a desired voltage to each bit line in accordance with write data DAT received from the memory controller 2. In the read operation, the sense amplifier module 16 determines data stored in a memory cell based on the voltage of the corresponding bit line, and transfers the determination result to the memory controller 2 as read data DAT.

The semiconductor memory device 1 and the memory controller 2 as described above may be combined to constitute one semiconductor device. Such a semiconductor device may be, for example, a memory card, such as an SD™ card, and a solid state drive (SSD).

[1-1-2] Circuit Configuration of Semiconductor Memory Device 1

(Regarding Circuit Configuration of Memory Cell Array 10)

FIG. 2 shows an example of the circuit configuration of the memory cell array 10 in the semiconductor memory device 1 according to the first embodiment, with one block BLK extracted out of a plurality of blocks BLK included in the memory cell array 10. As shown in FIG. 2, the block BLK includes, for example, four string units SU0 to SU3.

Each string unit SU includes a plurality of NAND strings NS associated with bit lines BL0 to BLm (m is an integer equal to or greater than 1), respectively. Each NAND string NS includes, for example, memory cell transistors MT0 to MT7 and select transistors ST1 and ST2. Each memory cell transistor MT includes a control gate and a charge storage layer, and holds data in a non-volatile manner. Each of the select transistors ST1 and ST2 is used to select a string unit SU in various operations.

In each NAND string NS, memory cell transistors MT0 to MT7 are coupled in series. A drain of the select transistor ST1 is coupled to an associated bit line BL, and a source of the select transistor ST1 is coupled to one end of the memory cell transistors MT0 to MT7 that are coupled in series. A drain of the select transistor ST2 is coupled to the other end of the memory cell transistors MT0 to MT7 that are coupled in series. A source of the select transistor ST2 is coupled to the source line SL.

The control gates of the memory cell transistors MT0 to MT7 in the same block BLK are coupled in common to respective word lines WL0 to WL7. The gates of the select transistors ST1 in each of the string units SU0 to SU3 are coupled in common to respective select gate lines SGD0 to SGD3. Gates of the select transistors ST2 are coupled in common to the select gate line SGS.

In the circuit configuration of the memory cell array 10 explained above, a bit line BL is shared by NAND strings NS that are assigned the same column address in each string unit SU. The source line SL is, for example, shared among a plurality of blocks BLK.

A group of memory cell transistors MT coupled to a common word line WL in a single string unit SU is referred to as, for example, a cell unit CU. For example, the memory capacity of a cell unit CU including memory cell transistors MT, which individually store 1-bit data, is defined as "1-page data". The cell unit CU may have a memory capacity of 2 or more pages of data, according to the number of bits of data stored in the memory cell transistor MT.

The memory cell array 10 included in the semiconductor memory device 1 according to the first embodiment is not limited to the configuration described above. For example, the numbers of memory cell transistors MT and select transistors ST1 and ST2 included in each NAND string NS may be designed to be any number. The number of string units SU included in each block BLK may be designed to be any number.

(Regarding Circuit Configuration of Sense Amplifier Module 16)

Figure 3:
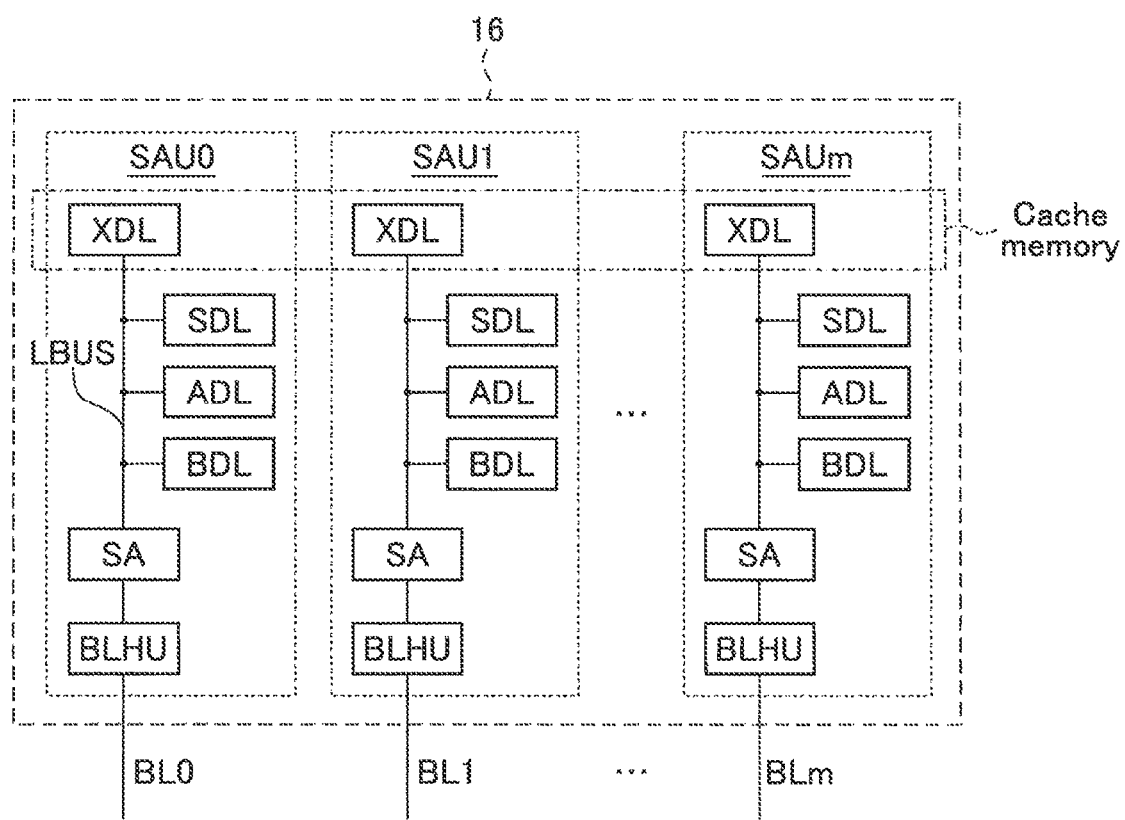
FIG. 3 is a circuit diagram showing an example of a circuit configuration of a sense amplifier module included in the semiconductor memory device according to the first embodiment.

FIG. 3 shows an example of a circuit diagram of the sense amplifier module 16 included in the semiconductor memory device 1 according to the first embodiment. As shown in FIG. 3, the sense amplifier module 16 includes, for example, sense amplifier units SAU0 to SAUm. Sense amplifier units SAU0 to SAUm are associated respectively with bit lines BL0 to BLm. Each sense amplifier unit SAU includes, for example, a bit line coupling unit BLHU, a sense amplifier SA, a bus LBUS, and latch circuits SDL, ADL, BDL, and XDL.

The bit line coupling unit BLHU is coupled between the associated bit line BL and the sense amplifier SA. For example, in a read operation, the sense amplifier SA determines whether the read data is "0" or "1" based on a voltage of the associated bit line BL. In other words, the sense amplifier SA senses data read to the associated bit line BL, and determines the data stored by the selected memory cell. Each of the latch circuits SDL, ADL, BDL, and XDL temporarily holds read data and write data, etc.

Each of the sense amplifier SA and the latch circuits SDL, ADL, BDL, and XDL is coupled to the bus LBUS, so that data can be transmitted and received therebetween via the bus LBUS. The latch circuit XDL is coupled to an input/output circuit (not shown), and is used to input and output data between the sense amplifier unit SAU and the input/output circuit. The latch circuit XDL can also be used as, for example, a cache memory of the semiconductor memory device 1. For example, the semiconductor memory device 1 can be in a ready state in the case where the latch XDL is available, even when the latch circuits SDL, ADL, and BDL are occupied.

FIG. 4 shows an example of a circuit configuration of the sense amplifier unit SAU in the semiconductor memory device 1 according to the first embodiment. As shown in FIG. 4, for example, the sense amplifier SA includes transistors 20 to 27 and a capacitor 28, and the bit line coupling unit BLHU includes transistors 30 and 31.

The transistor 20 is a p-type MOS transistor. Each of the transistors 21 to 27 is an n-type MOS transistor. Each of the transistors 30 and 31 is an n-type MOS transistor that has a higher breakdown-voltage than each of the transistors 20 to 27. In the following, the transistors 20 to 27 will be referred to as low-breakdown-voltage transistors, and the transistors 30 and 31 will be referred to as high-breakdown-voltage transistors.

A source of the transistor 20 is coupled to a power line. A drain of the transistor 20 is coupled to a node ND1. A gate of the transistor 20 is coupled to, for example, a node INV inside the latch circuit SDL. A drain of the transistor 21 is coupled to the node ND1. A source of the transistor 21 is coupled to a node ND2. A control signal BLX is input to a gate of the transistor 21. A drain of the transistor 22 is coupled to the node ND1. A source of the transistor 22 is coupled to a node SEN. A control signal HLL is input to a gate of the transistor 22.

A drain of the transistor 23 is coupled to the node SEN. A source of the transistor 23 is coupled to the node ND2. A control signal XXL is input to a gate of the transistor 23. A drain of the transistor 24 is coupled to the node ND2. A control signal BLC is input to a gate of the transistor 24. A drain of the transistor 25 is coupled to the node ND2. A source of the transistor 25 is coupled to a node SRC. A gate of the transistor 25 is coupled to, for example, the node INV inside the latch circuit SDL.

A source of the transistor 26 is grounded. A gate of the transistor 26 is coupled to the node SEN. A drain of the transistor 27 is coupled to the bus LBUS. A source of the transistor 27 is coupled to a drain of the transistor 26. A control signal STB is input to a gate of the transistor 27. One electrode of the capacitor 28 is coupled to the node SEN. A clock CLK is input to the other electrode of the capacitor 28.

A drain of the transistor 30 is coupled to a source of the transistor 24. A source of the transistor 30 is coupled to the bit line BL. A control signal BLS is input to a gate of the transistor 30. A drain of the transistor 31 is coupled to a node BLBIAS. A source of the transistor 31 is coupled to the bit line BL. A control signal BIAS is input to a gate of the transistor 31.

In the above-described circuit configuration of the sense amplifier unit SAU, for example, a source voltage VDD is applied to the power line coupled to the source of the transistor 20. A ground voltage VSS is, for example, applied to the node SRC. Each of the control signals BLX, HLL, XXL, BLC, STB, BLS, and BIAS, as well as the clock CLK is generated by, for example, the sequencer 13. The sense amplifier SA determines the data read to the bit line BL based on, for example, the timing at which the control signal STB is asserted.

The sense amplifier module 16 included in the semiconductor memory device 1 according to the first embodiment is not limited to the circuit configuration described above. For example, the number of latch circuits in each of the sense amplifier units SAU can be changed as appropriate based on the number of pages stored in one cell unit CU. Other circuit configurations may also be used as long as the sense amplifier SA is able to determine the data read to the bit line BL.

[1-1-3] Structure of Semiconductor Memory Device 1

In the following, a structure of the semiconductor memory device 1 according to the first embodiment will be described. In the drawings referred to below, an X direction corresponds to the extending direction of the word lines WL, a Y direction corresponds to the extending direction of the bit lines BL, and a Z direction corresponds to a direction vertical to the surface of a semiconductor substrate on which the semiconductor memory device 1 is formed. In the plan views, a hatch pattern is applied, where necessary, for viewability. The hatch pattern applied to the planar views does not necessarily relate to the material or characteristics of the hatched structural elements. In the drawings referred to in the present specification, structural elements such as an interconnect and a contact are omitted as appropriate for viewability.

(Regarding Overall Structure of Semiconductor Memory Device 1)

Figure 5:
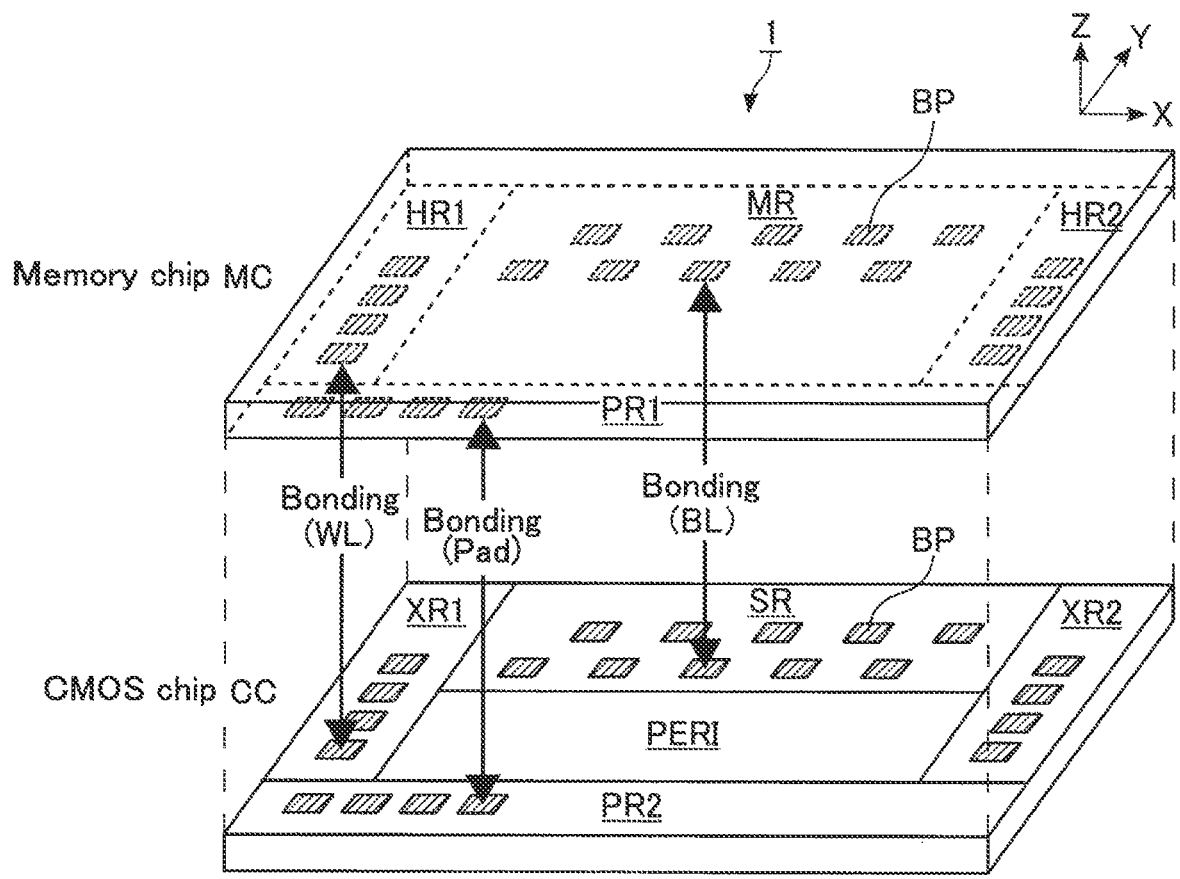
FIG. 5 is a perspective view showing a structure example of the semiconductor memory device according to the first embodiment.

FIG. 5 shows an example of an overall structure of the semiconductor memory device 1 according to the first embodiment. As shown in FIG. 5, the semiconductor memory device 1 includes a memory chip MC and a CMOS chip CC, and has a structure in which the lower surface of the memory chip MC and the upper surface of the CMOS chip CC are bonded together. The memory chip MC includes a structure that corresponds to the memory cell array 10. The CMOS chip CC includes, for example, the command register 11, the address register 12, the sequencer 13, the driver module 14, the row decoder module 15, and the sense amplifier module 16.

The region of the memory chip MC is divided into, for example, a memory region MR, hookup regions HR1 and HR2, and a pad region PR1. NAND strings NS are provided in the memory region MR. The memory region MR is interposed between, for example, the hookup areas HR1 and HR2 in the X direction. The pad region PR1 is adjacent to, for example, the memory region MR and the hookup regions HR1 and HR2 in the Y direction.

The region of the CMOS chip CC is divided into, for example, a sense amplifier region SR, a peripheral circuit region PERI, transfer regions XR1 and XR2, and a pad region PR2. In the sense amplifier region SR, the sense amplifier module 16 is provided. In the peripheral circuit region PERI, for example, the sequencer 13 is provided. In the transfer regions XR1 and XR2, for example, the row decoder module 15 is provided. The sense amplifier region SR and the peripheral circuit region PERI are respectively adjacent in the X direction. For example, a pair of the sense amplifier region SR and the peripheral circuit region PERI is arranged in a manner overlapping the memory region MR in the memory chip MC, and is interposed between the transfer regions XR1 and XR2 in the X direction. The transfer regions XR1 and XR2 each overlap the hookup regions HR1 and HR2 in the memory chip MC. In the pad region PR2, for example, the input/output circuit of the semiconductor memory device 1 is provided. The pad region PR2 overlaps the pad region PR1 in the memory chip MC.

The memory chip MC includes a plurality of bonding pads BP on the lower part of each of the memory region MR, the hookup regions HR1 and HR2, and the pad region PR1. The CMOS chip CC includes a plurality of bonding pads BP on the upper part of each of the sense amplifier region SR, the peripheral circuit region PERI, the transfer regions XR1 and XR2, and the pad region PR2.

The bonding pads BP in the memory region MR are electrically coupled to the bit line BL, and are arranged in such a manner that they overlap the bonding pads BP in the sense amplifier region SR. The bonding pads BP in the hookup region HR1 are electrically coupled to the word line WL, and are arranged in such a manner that they overlap the bonding pads BP in the transfer region XR1. The bonding pads BP in the hookup region HR2 are electrically coupled to the word line WL, and are arranged in such a manner that they overlap the bonding pads BP in the transfer region XR2. The bonding pads BP in the pad region PR1 are arranged in such a manner that they overlap the bonding pads BP in the pad region PR2. In each region, the bonding pads BP facing each other between the memory chip MC and the CMOS chip CC are bonded together, and electrically coupled.

The overall structure of the semiconductor memory device 1 according to the first embodiment is not limited to the structure described above. For example, at least one hookup region HR that is adjacent to the memory region MR needs to be provided. The semiconductor memory device 1 may have a plurality of pairs of memory region MR and hookup region HR. In this case, a set of sense amplifier region SR, transfer region XR, and peripheral circuit region PERI is provided as appropriate in accordance with the arrangement of the memory region MR and the hookup region HR.

(Regarding Structure in Memory Region MR of Semiconductor Memory Device 1)

Figure 6:
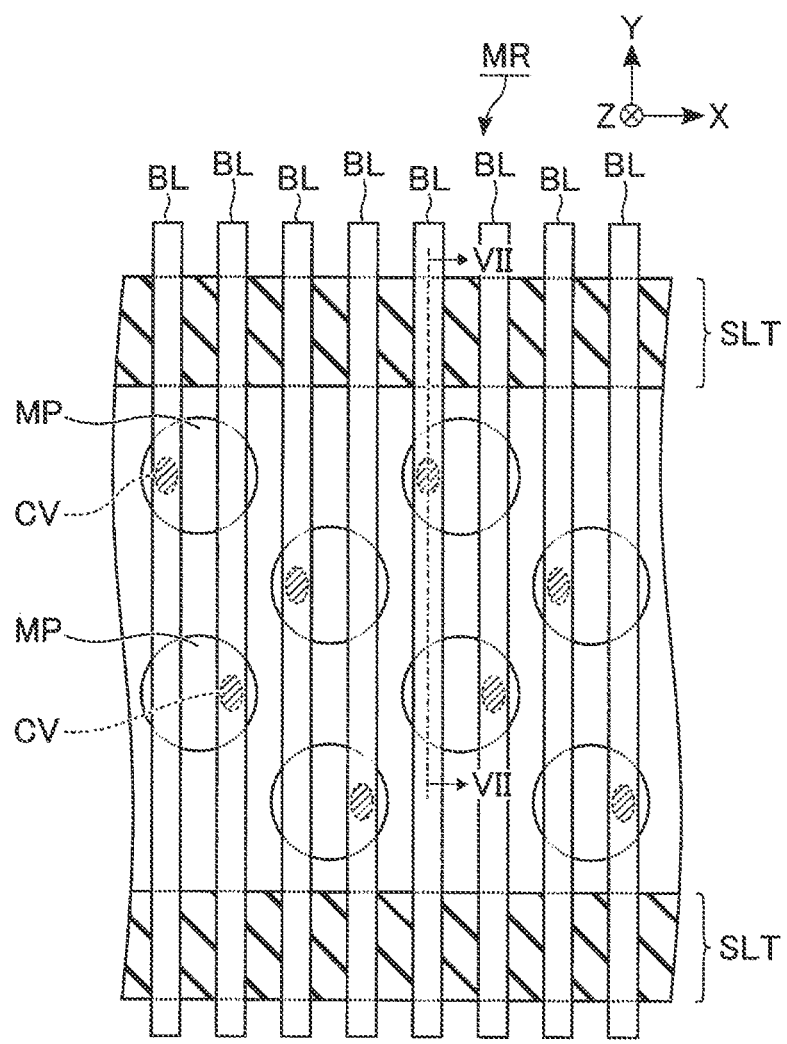
FIG. 6 is a plan view showing an example of a planar layout in a memory region of the semiconductor memory device according to the first embodiment.

FIG. 6 shows an example of a planar layout in the memory region MR of the semiconductor memory device 1 according to the first embodiment. As shown in FIG. 6, in the memory region MR, the semiconductor memory device 1 includes a plurality of slits SLT, a plurality of memory pillars MP, a plurality of contacts CV, and a plurality of bit lines BL.

Each of the plurality of slits SLT extends along the X direction, and extends across the memory region MR in the X direction. The plurality of slits SLT are aligned in the Y direction. Each slit SLT has a structure in which, for example, an insulating member is embedded inside, and each slit SLT divides conductive layers that are provided on the same interconnect layer and are adjacent to each other via the slit SLT. Specifically, each slit SLT divides, for example, a plurality of interconnect layers that correspond to word lines WL0 to WL7 and the select gate lines SGD and SGS, respectively.

Each of the memory pillars MP functions, for example, as a NAND string NS. For example, a plurality of memory pillars MP are arranged in a zigzag manner in four rows in the region between two adjacent slits SLT. However, the number and arrangement of the memory pillars MP between two adjacent slits SLT are not limited thereto, and may be suitably varied. A set of memory pillars MP arranged between the adjacent slits SLT corresponds to, for example, one string unit SU.

A plurality of bit lines BL extend in the Y direction, and are aligned in the X direction. Each bit line BL is arranged to overlap at least one memory pillar MP in each string unit SU. In the present example, two bit lines BL are arranged to overlap each memory pillar MP. A contact CV is provided between a memory pillar MP and one of the bit lines BL overlapping the memory pillar MP. Each memory pillar MP is electrically coupled to the corresponding bit line BL via the contact CV.

Figure 7:
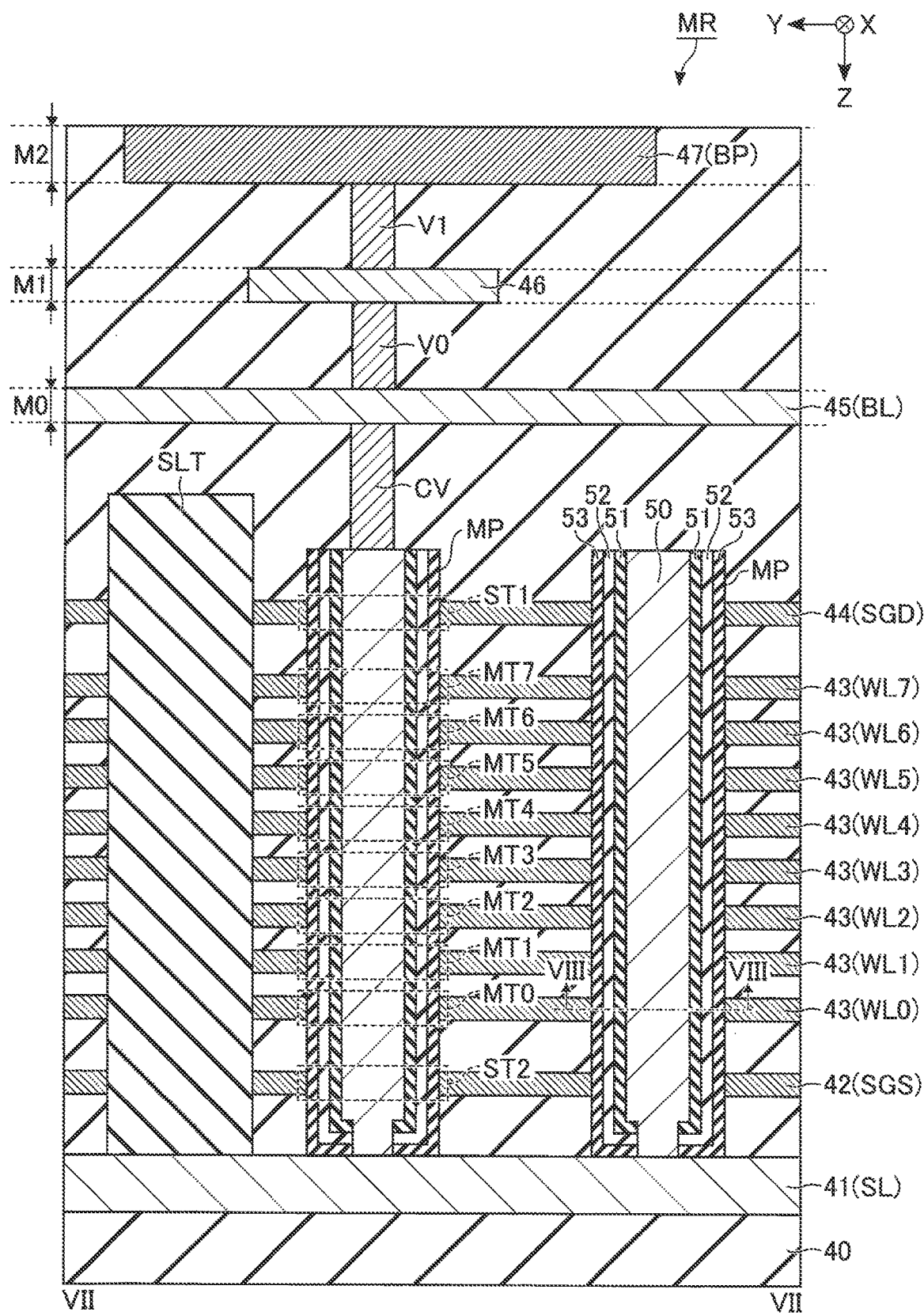
FIG. 7 is a cross-sectional view, taken along line VII-VII of FIG. 6, showing an example of a cross-sectional structure of the memory region of the semiconductor memory device according to the first embodiment.

FIG. 7 is a cross-sectional view taken along line VII-VII of FIG. 6, and shows an example of a cross-sectional structure of the memory region MR in the semiconductor memory device 1 according to the first embodiment. The semiconductor memory device 1 in FIG. 7 is shown upside down; therefore, the bonding pad BP is positioned on the upper side of FIG. 7. As shown in FIG. 7, the semiconductor memory device 1 further includes in the memory region MR, for example, an insulating layer 40, conductive layers 41 to 47, and contacts V0 and V1.

The insulating layer 40 is an insulating layer that is provided on an uppermost layer in the illustrated region. The conductive layer 41 is provided below the insulating layer 40. The conductive layer 41 is formed in, for example, a plate-like shape extending along the XY plane, and is used as a source line SL. The conductive layer 41 includes, for example, silicon (Si).

The conductive layer 42 is provided below the conductive layer 41, with an insulating layer interposed therebetween. The conductive layer 42 is formed in, for example, a plate-like shape extending along the XY plane, and is used as the select gate line SGS. The conductive layer 42 includes, for example, tungsten (W).

The conductive layers 43 and the insulating layers are alternately stacked below the conductive layer 42. Each conductive layer 43 is formed in, for example, a plate-like shape extending along the XY plane. The stacked conductive layers 43 are, in the order from the side of the insulating layer 40, used as word lines WL0 to WL7. The conductive layer 43 includes, for example, tungsten (W).

The conductive layer 44 is provided below a lowermost conductive layer 43, with an insulating layer interposed therebetween. The conductive layer 44 is formed in, for example, a plate-like shape extending in the XY plane, and is used as the select gate line SGD. The conductive layer 44 includes, for example, tungsten (W).

The conductive layer 45 is provided below the conductive layer 44, with an insulating layer interposed therebetween. The conductive layer 45 is formed in, for example, a linear shape extending in the Y direction, and is used as the bit line BL. That is, a plurality of conductive layers 45 are aligned along the X direction in a region that is not shown. The conductive layer 45 includes, for example, copper (Cu). Hereinafter, an interconnect layer in which the conductive layer 45 (the bit line BL) is provided will be referred to as an interconnect layer M0.

The conductive layer 46 is provided below the conductive layer 45, with an insulating layer interposed therebetween. The conductive layer 46 is used as, for example, an interconnect that relays the coupling between the bonding pad BP and the bit line BL. For example, the conductive layer 46 and the conductive layer 45 (the bit line BL) are coupled by the contact V0. The conductive layer 46 includes, for example, copper (Cu). Hereinafter, an interconnect layer in which the conductive layer 46 is provided will be referred to as an interconnect layer M1.

The conductive layer 47 is provided below the conductive layer 46, with an insulating layer interposed therebetween. The conductive layer 47 is used as the bonding pad BP, and is arranged at the lowermost part of the memory region MR. For example, the conductive layer 47 (the bonding pad BP) and the conductive layer 46 are coupled by the contact V1. The conductive layer 47 includes, for example, copper (Cu). Hereinafter, an interconnect layer in which the conductive layer 47 is provided will be referred to as an interconnect layer M2.

The slit SLT is formed in, for example, a plate-like shape extending along the XZ plane, and divides the conductive layers 42 to 44. The upper end of the slit SLT is brought into contact with, for example, the conductive layer 41. The bottom end of the slit SLT is included in a layer between, for example, the conductive layers 44 and 45.

Each of the memory pillars MP extends along the Z direction, and penetrates the conductive layers 42 to 44. The upper part of the memory pillar MP is brought into contact with the conductive layer 41. Each of the memory pillars MP includes, for example, a semiconductor layer 50, a tunnel insulating film 51, an insulating film 52, and a block insulating film 53.

The semiconductor layer 50 is provided in a manner extending in the Z direction. For example, an upper end of the semiconductor layer 50 is in contact with the conductive layer 41, and a lower end of the semiconductor layer 50 is included in a layer between the conductive layers 44 and 45.

The tunnel insulating film 51 covers the side surface of the semiconductor layer 50. The insulating film 52 covers the side surface of the tunnel insulating film 51. The block insulating film 53 covers the side surface of the insulating film 52. Both of the tunnel insulating film 51 and the block insulating film 53 include, for example, silicon oxide ($SiO_2$). The insulating film 52 includes, for example, silicon nitride (SiN).

A pillar-shaped contact CV is provided below the semiconductor layer 50 inside the memory pillar MP. In the illustrated region, a contact CV that corresponds to one of the two memory pillars MP is shown. For the memory pillar MP to which the contact CV is not coupled in the above region, a contact CV is coupled thereto in a region that is not illustrated.

A lower surface of the contact CV is in contact with one of the conductive layers 45, that is, one of the bit lines BL. One contact CV is coupled to one conductive layer 45 in each of the spaces that is partitioned by the slit SLT. In other words, one memory pillar MP arranged between two adjacent slits SLT is electrically coupled to each of the conductive layers 45.

Figure 8:
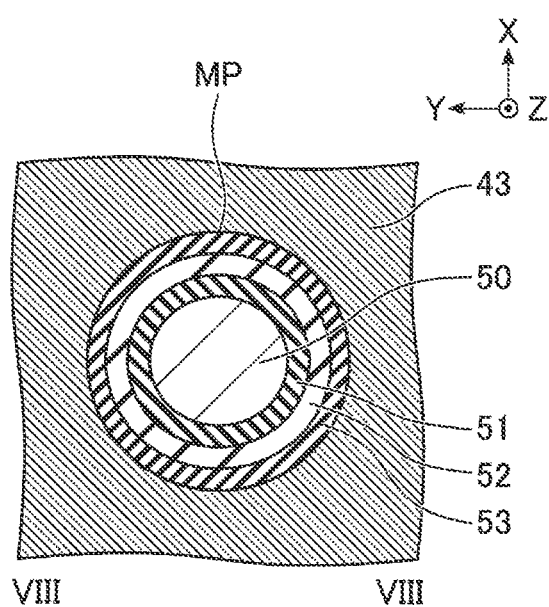
FIG. 8 is a cross-sectional view, taken along line VIII-VIII of FIG. 7, showing an example of a cross-sectional structure of a memory pillar in the semiconductor memory device according to the first embodiment.

FIG. 8 is a cross-sectional view taken along line VIII-VIII of FIG. 7, and shows an example of a cross-sectional structure of the memory pillar MP in the semiconductor memory device 1 according to the first embodiment. As shown in FIG. 8, in the layer including the conductive layer 43, the semiconductor layer 50 is provided at, for example, the center of the memory pillar MP. The tunnel insulating film 51 surrounds the side surface of the semiconductor layer 50. The insulating film 52 surrounds the side surface of the tunnel insulating film 51. The block insulating film 53 surrounds the side surface of the insulating film 52. The conductive layer 43 surrounds the side surface of the block insulating film 53. Each of the memory pillars MP may further include an insulating layer inside the semiconductor layer 50, and the insulating layer may be positioned at the center of the memory pillar MP.

In the above-described structure of the memory pillar MP, a portion at which the memory pillar MP and conductive layer 42 intersect functions as the select transistor ST2. The portion at which the memory pillar MP and the conductive layer 43 intersect functions as the memory cell transistor MT. The portion at which the memory pillar MP and the conductive layer 44 intersect functions as the select transistor ST1. That is, the semiconductor layer 50 functions as a channel of each of the memory cell transistors MT0 to MT7 and the select transistors ST1 and ST2. The insulating film 52 functions as a charge storage layer of the memory cell transistor MT.

(Regarding Structure in Sense Amplifier Region SR of Semiconductor Memory Device 1)

FIG. 9 shows an example of a planar layout in the sense amplifier region SR of the semiconductor memory device 1 according to the first embodiment. As shown in FIG. 9, in the sense amplifier region SR, for example, a plurality of sense amplifier groups SAG1 to SAGk (k is an even number) are arranged. For example, sense amplifier groups SAG with odd numbers and sense amplifier groups SAG with even numbers are aligned, respectively, in the X direction. Sense amplifier groups SAG with odd numbers are adjacent to sense amplifier groups SAG with even numbers in the Y direction. Specifically, for example, sense amplifier groups SAG1 and SAG3 are adjacent to sense amplifier groups SAG2 and SAG4, respectively, in the Y direction.

Each sense amplifier group SAG includes a plurality of pairs of the bit line coupling unit BLHU and the sense amplifier SA. In this example, each of the sense amplifier groups SAG includes two pairs of the bit line coupling unit BLHU and the sense amplifier SA. Specifically, the sense amplifier group SAG1 includes bit line coupling units BLHU <0> and <1> and sense amplifiers SA<0> and <1>. The sense amplifier group SAG2 includes bit line coupling units BLHU <2> and <3> and sense amplifiers SA<2> and <3>. The sense amplifier group SAG3 includes bit line coupling units BLHU <4> and <5> and sense amplifiers SA<4> and <5>. The sense amplifier group SAG4 includes bit line coupling units BLHU <6> and <7> and sense amplifiers SA<6> and <7>. A pair of bit line coupling unit BLHU <i> and sense amplifier SA<i> (i is an integer equal to or greater than 0) corresponds to a sense amplifier unit SAUi.

Here, focusing on the sense amplifier group SAG1, an example of a layout of a sense amplifier group SAG with odd numbers will be briefly explained. The bit line coupling unit BLHU <0> and the bit line coupling unit BLHU <1> are adjacent to each other in the Y direction. The sense amplifier SA<0> and the sense amplifier SA<1> are adjacent to each other in the X direction. The pair of bit line coupling units BLHU <0> and <1> and the pair of sense amplifiers SA<0> and <1> are adjacent to each other in the Y direction. The sense amplifier groups SAG with even numbers have a layout obtained by, for example, inverting the layout of the sense amplifier groups SAG with odd numbers with the X direction taken as a symmetrical axis.

FIG. 10 shows an example of a detailed planar layout of the sense amplifier group SAG in the semiconductor memory device 1 according to the first embodiment. As shown in FIG. 10, the sense amplifier group SAG, for example, includes a plurality of active regions AA, a plurality of gate lines GC1 to GC6, and nodes N1 to N11.

The active region AA is an impurity diffusion region used when forming a transistor, and is provided on a semiconductor substrate that corresponds to the CMOS chip CC. Adjacent active regions AA are separated by, for example, shallow trench isolation (STI). A plurality of active regions AA include an active region AA(HV) in which a high-breakdown-voltage transistor is formed, and an active region AA(LV) in which a low-breakdown-voltage transistor is formed.

The active region AA(HV) extends in the Y direction and across each of the regions corresponding to the bit line coupling units BLHU <0> and <1>. On the active region AA(HV), for example, nodes N1 to N5 are arranged along the Y direction. Two active regions AA(LV) each extend in the Y direction and are adjacent to each other in the X direction. The two active regions AA(LV) correspond to the sense amplifiers SA<0> and <1>, respectively. For the active region AA(LV) corresponding to the sense amplifier SA<0>, for example, nodes N6 to N8 are arranged along the Y direction. For the active region AA(LV) corresponding to the sense amplifier SA<1>, for example, nodes N9 to N11 are arranged along the Y direction.

Each of a plurality of gate lines GC is provided extending in the X direction, and is aligned in the Y direction. Furthermore, each of the plurality of gate lines GC is shared by, for example, a plurality of sense amplifier groups SAG aligned in the X direction. The gate lines GC1 to GC4 intersect the active region AA(HV). The gate lines GC5 and GC6 intersect the active region AA(LV). Specifically, the gate line GC1 is provided between nodes N1 and N2. The gate line GC2 is provided between nodes N2 and N3. The gate line GC3 is provided between nodes N3 and N4. The gate line GC4 is provided between nodes N4 and N5. The gate line GC5 is provided in a continuous manner between nodes N6 and N7 and between nodes N9 and N10. The gate line GC6 is provided in a continuous manner between nodes N7 and N8 and between nodes N10 and N11.

The control signal BLS is input to each of the gate lines GC1 and GC4. The control signal BIAS is input to each of the gate lines GC2 and GC3. The control signal BLC is input to the gate line GC5. The control signal BLX is input to the gate line GC6. In other words, that between the nodes N1 and N2 corresponds to the transistor 30 of the bit line coupling unit BLHU <0>. That between the nodes N2 and N3 corresponds to the transistor 31 of the bit line coupling unit BLHU <0>. That between the nodes N3 and N4 corresponds to the transistor 31 of the bit line coupling unit BLHU <1>. That between the nodes N4 and N5 corresponds to the transistor 30 of the bit line coupling unit BLHU <1>. That between the nodes N6 and N7 corresponds to the transistor 24 of the sense amplifier SA<0>. That between the nodes N7 and N8 corresponds to the transistor 21 of the sense amplifier SA<0>. That between the nodes N9 and N10 corresponds to the transistor 24 of the sense amplifier SA<i>. That between the nodes N10 and N11 corresponds to the transistor 21 of the sense amplifier SA<1>.

As explained above, for example, two transistors 31 corresponding respectively to the bit line coupling units BLHU <0> and BLHU <1> are coupled in series between two transistors 30 corresponding respectively to the bit line coupling units BLHU <0> and BLHU <1>, that is, between the node N2 and the node N4. The two transistors 31 corresponding respectively to the bit line coupling units BLHU <0> and BLHU <1> share the node N3.

Furthermore, in the sense amplifier group SAG explained above, for example, the width of the active region AA(HV) is wider than the width of the active region AA(LV) in the X direction. For example, the width of the gate line GC corresponding to the high-breakdown-voltage transistor is wider than the width of the gate line GC corresponding to the low-breakdown-voltage transistor in the Y direction. The active region AA(LV) corresponding to the sense amplifier SA may extend to a region not shown, and a transistor other than the transistors 21 and 24 inside the sense amplifier SA may be provided in such region. The node N1 is electrically coupled to the node N6 (that is, the transistor 24 of the sense amplifier SA<0>). The node N2 is electrically coupled to the bit line BL associated with the sense amplifier unit SAU0. The node N3 is shared by the transistors 31 of each of the bit line coupling units BLHU <0> and <1> and is electrically coupled to the node BLBIAS. The node N4 is electrically coupled to the bit line BL associated with the sense amplifier unit SAU1. The node N5 is electrically coupled to the node N9 (that is, the transistor 24 of the sense amplifier SA<1>).

Figure 11:
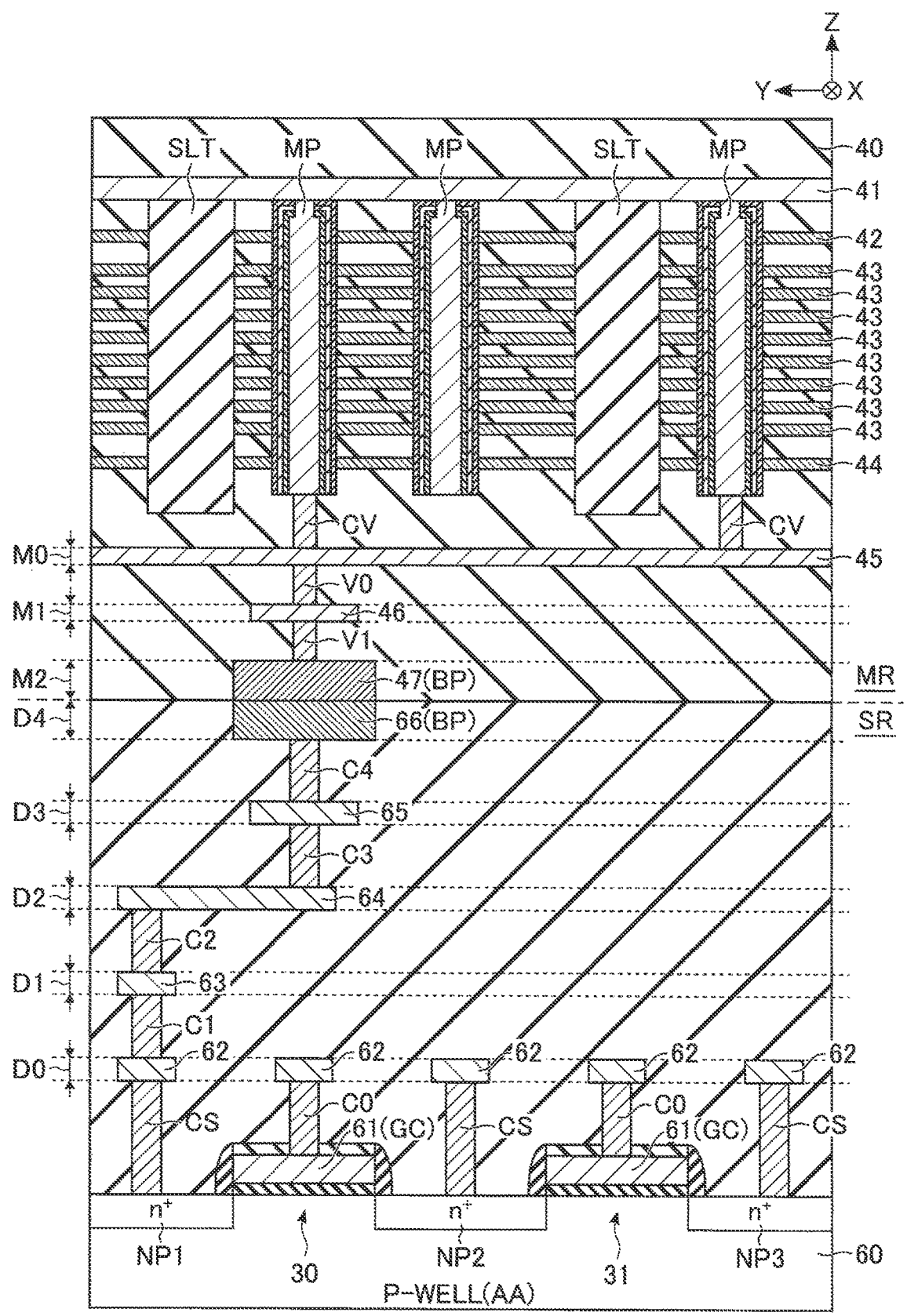
FIG. 11 is a cross-sectional view showing an example of a cross-sectional structure of the sense amplifier region of the semiconductor memory device according to the first embodiment.

FIG. 11 shows an example of a cross-sectional structure in the sense amplifier region SR of the semiconductor memory device 1 according to the first embodiment. FIG. 11 shows a region including the transistors 30 and 31 and the bonding pad BP together with the memory region MR arranged on the sense amplifier region SR. As shown in FIG. 11, in the sense amplifier region SR, the semiconductor memory device 1 includes, for example, a p-type well region 60, conductive layers 61 to 66, and pillar-shaped contacts CS and C0 to C4.

The p-type well region 60 includes p-type impurities, and corresponds to the active region AA on which the high-breakdown-voltage transistor is provided. Furthermore, the p-type region 60 includes, for example, n-type regions NP1 to NP3 lined up in the Y direction. Each of the n-type regions NP1 to NP3 is a region in which n-type impurities are diffused, and is provided near the surface of the p-type well region 60.

The conductor layer 61 is provided above a portion between the n-type regions NP1 and NP2 of the p-type well region 60 with a gate insulating film interposed therebetween. Similarly, the conductor layer 61 is provided above a portion between the n-type regions NP2 and NP3 of the p-type well region 60 with a gate insulating film interposed therebetween. The conductive layer 61 is used as the gate line GC. In other words, the conductive layer 61 between the n-type regions NP1 and NP2 corresponds to the transistor 30 in the bit line coupling unit BLHU, and the conductive layer 61 between the n-type regions NP2 and NP3 corresponds to the transistor 31 in the bit line coupling unit BLHU.

The contact CS is provided respectively on the n-type regions NP1 to NP3. The contact C0 is provided respectively on the plurality of conductive layers 61. For example, the upper surface of the contact CS and the upper surface of the contact C0 are aligned. Furthermore, one conductive layer 62 is provided on each of the contacts CS and C0. The contact C1 is provided on the conductive layer 62. A conductive layer 63 is provided on the contact C1. A contact C2 is provided on the conductive layer 63. A conductive layer 64 is provided on the contact C2. A contact C3 is provided on the conductive layer 64. A conductive layer 65 is provided on the contact C3. A contact C4 is provided on the conductive layer 65. A conductive layer 66 is provided on the contact C4. The conductive layer 66 includes, for example, copper (Cu). Hereinafter, a plurality of interconnect layers in which each of the conductive layers 62, 63, 64, 65, and 66 is provided will be referred to respectively as interconnect layers D0, D1, D2, D3, and D4.

The conductive layer 66 is used as the bonding pad BP, and is arranged at the uppermost part of the sense amplifier region SR. The conductive layer 66 is electrically coupled to a facing conductive layer 47. In other words, the conductive layer 66 (the bonding pad BP) inside the sense amplifier region SR is bonded with the conductive layer 47 inside the facing memory region MR. Furthermore, the conductive layer 66 in the first embodiment is arranged, for example, above the transistor 30.

In the following, an example of a detailed planar layout of the bonding pad BP in the sense amplifier region SR will be explained. FIG. 12 shows an example of a planar layout of the bonding pad BP, the active region AA, and the gate line GC in the sense amplifier region SR of the semiconductor memory device 1 according to the first embodiment. Specifically, FIG. 12 shows the sense amplifier group SAG1 corresponding to FIG. 10 and the sense amplifier group SAG3 that is adjacent to the sense amplifier group SAG1.

As shown in FIG. 12, a plurality of bonding pads BP are arranged to correspond respectively to the bit line coupling units BLHU <0>, BLHU <1>, BLHU <4>, and BLHU <5>. Furthermore, a margin shown by a chain line is appropriately designed around each of the bonding pads BP, and the adjacent bonding pads BP are arranged so as not to overlap each other's margin part. For example, in a case where two bonding pads BP are adjacent in the X direction or the Y direction, the margin parts of the bonding pads BP are set so that the two bonding pads can be formed in such a manner. Specifically, the width of the margin part of the bonding pad BP in the X direction is set, for example, to double the width of the bonding pad BP in the X direction. Similarly, the width of the margin part of the bonding pad BP in the Y direction is set, for example, to double the width of the bonding pad BP in the Y direction.

The bonding pad BP corresponding to the bit line coupling unit BLHU <0> is arranged, for example, in a manner overlapping the gate line GC1. The bonding pad BP corresponding to the bit line coupling unit BLHU <1> is arranged, for example, in a manner overlapping the gate line GC4. The bonding pad BP corresponding to the bit line coupling unit BLHU <4> is arranged, for example, in a manner overlapping the gate line GC2. The bonding pad BP corresponding to the bit line coupling unit BLHU <5> is arranged, for example, in a manner overlapping the gate line GC3.

In other words, the bonding pad BP corresponding to the bit line coupling unit BLHU <0> is arranged in a manner overlapping the transistor 30 to which the control signal BLS is input in the bit line coupling unit BLHU <0>. The bonding pad BP corresponding to the bit line coupling unit BLHU <1> is arranged in a manner overlapping the transistor 30 to which the control signal BLS is input in the bit line coupling unit BLHU <1>. The bonding pad BP corresponding to the bit line coupling unit BLHU <4> is arranged in a manner overlapping the transistor 31 to which the control signal BIAS is input in the bit line coupling unit BLHU <4>. The bonding pad BP corresponding to the bit line coupling unit BLHU <5> is arranged in a manner overlapping the transistor 31 to which the control signal BIAS is input in the bit line coupling unit BLHU <5>. In the above manner, each of the bonding pads BP is arranged inside the region of the bit line coupling unit BLHU.

The arrangement of the bonding pad BP explained above is only an example; therefore, it is not limited thereto. Each of the bonding pads BP only needs to have a margin secured between the adjacent bonding pads BP, and overlap a region corresponding to the associated bit line coupling unit BLHU. For example, the bonding pad BP corresponding to the bit line coupling unit BLHU <0> should at least overlap the active region AA(HV) corresponding to the bit line coupling unit BLHU <0>. More specifically, the bonding pad BP corresponding to the bit line coupling unit BLHU <0> should overlap, for example, the gate line GC1 and/or GC2, that is, at least one of the transistors 30 and 31 in the bit line coupling unit BLHU <0>. The same also applies to the other bonding pads BP.

Furthermore, the bonding pad BP in the semiconductor memory device 1 according to the first embodiment may also be provided in the region of the sense amplifier SA. The bonding pad BP provided in the region of the sense amplifier SA will be used as a dummy bonding pad BP. For example, the dummy bonding pad BP will not be coupled to a circuit inside the CMOS chip CC, and will be bonded with, for example, a dummy bonding pad BP that the dummy bonding pad BP faces in the memory chip MC.

Figure 13:
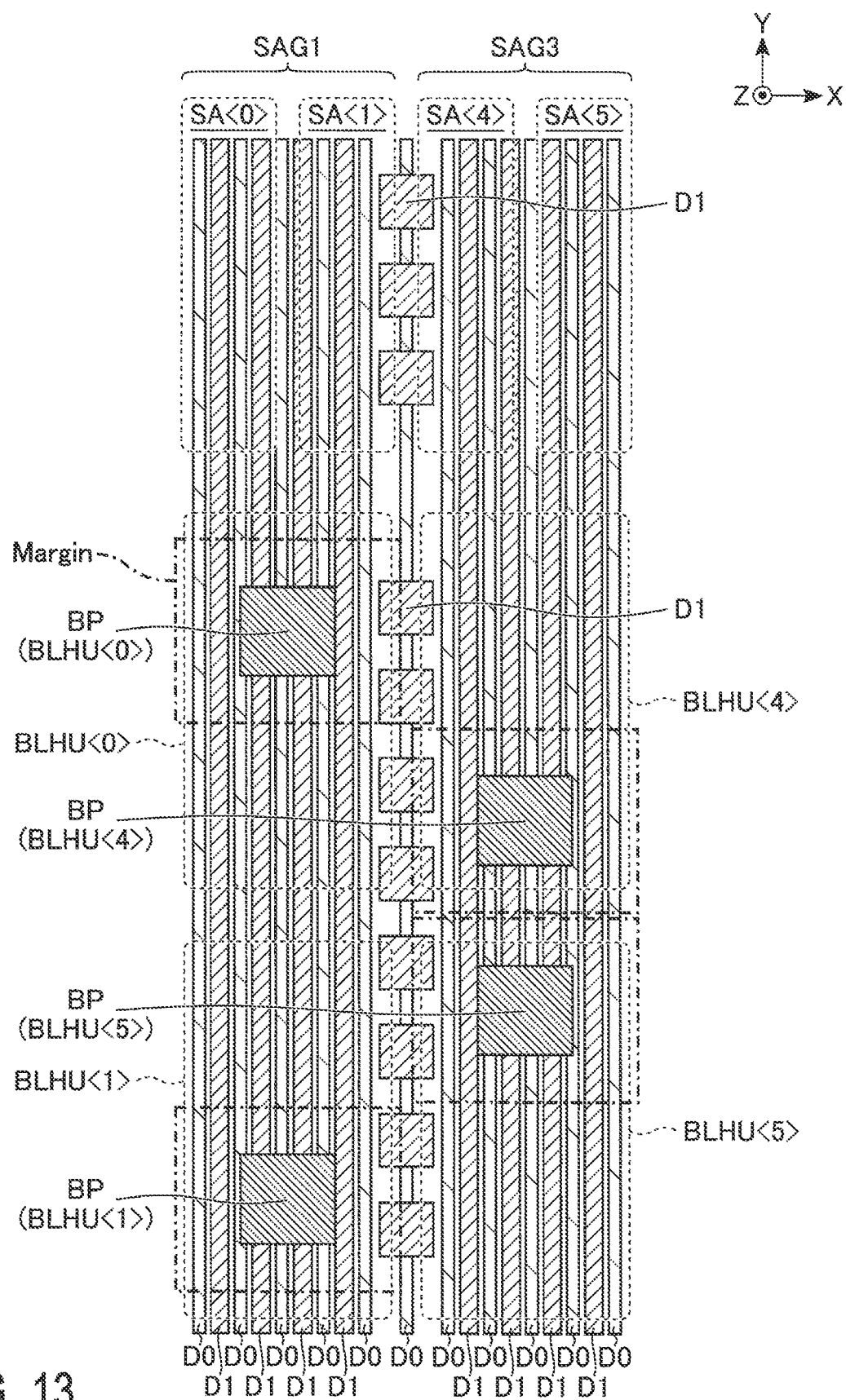
FIG. 13 is a plan view showing an example of a planar layout of the bonding pad and interconnect layers D0 and D1 in the sense amplifier region of the semiconductor memory device according to the first embodiment.

FIG. 13 shows an example of a planar layout of the bonding pad BP, and the interconnect layers D0 and D1 in the sense amplifier region SR of the semiconductor memory device 1 according to the first embodiment. The region shown in FIG. 13 is a region that overlaps FIG. 12, and the illustrated interconnect layers D0 and D1 correspond respectively to the arrangements of the conductive layers 62 and 63.

As shown in FIG. 13, the interconnect layer D0 includes, for example, a plurality of conductive layers 62 each extended in the Y direction. The interconnect layer D1 includes, for example, a plurality of conductive layers 63 each extended in the Y direction, and pad-like conductive layers 63.

For example, in each of the regions of the bit line coupling unit BLHU and the sense amplifier SA, at least one conductive layer 62 inside the interconnect layer D0 is overlapped. Similarly, in each of the regions of the bit line coupling unit BLHU and the sense amplifier SA, at least one conductive layer 63 inside the interconnect layer D1 is overlapped. The pad-like conductive layer 63 is arranged, for example, between the adjacent sense amplifier groups SAG.

In the illustrated region, the interconnect inside the interconnect layer D0 is used as an interconnect used in the circuit of the sense amplifier module 16, etc. The interconnect inside the interconnect layer D1 is used as a data bus, a shield, or a pad for joining the upper and lower interconnect layers. In FIG. 13, a case in which the conductive layer 62 extended in the Y direction inside the interconnect layer D0 and the conductive layer 63 extended in the Y direction inside the interconnect layer D1 do not overlap has been shown. However, the conductive layers 62 and 63 may overlap in accordance with the coupling between the interconnect layers D0 and D1.

Figure 14:
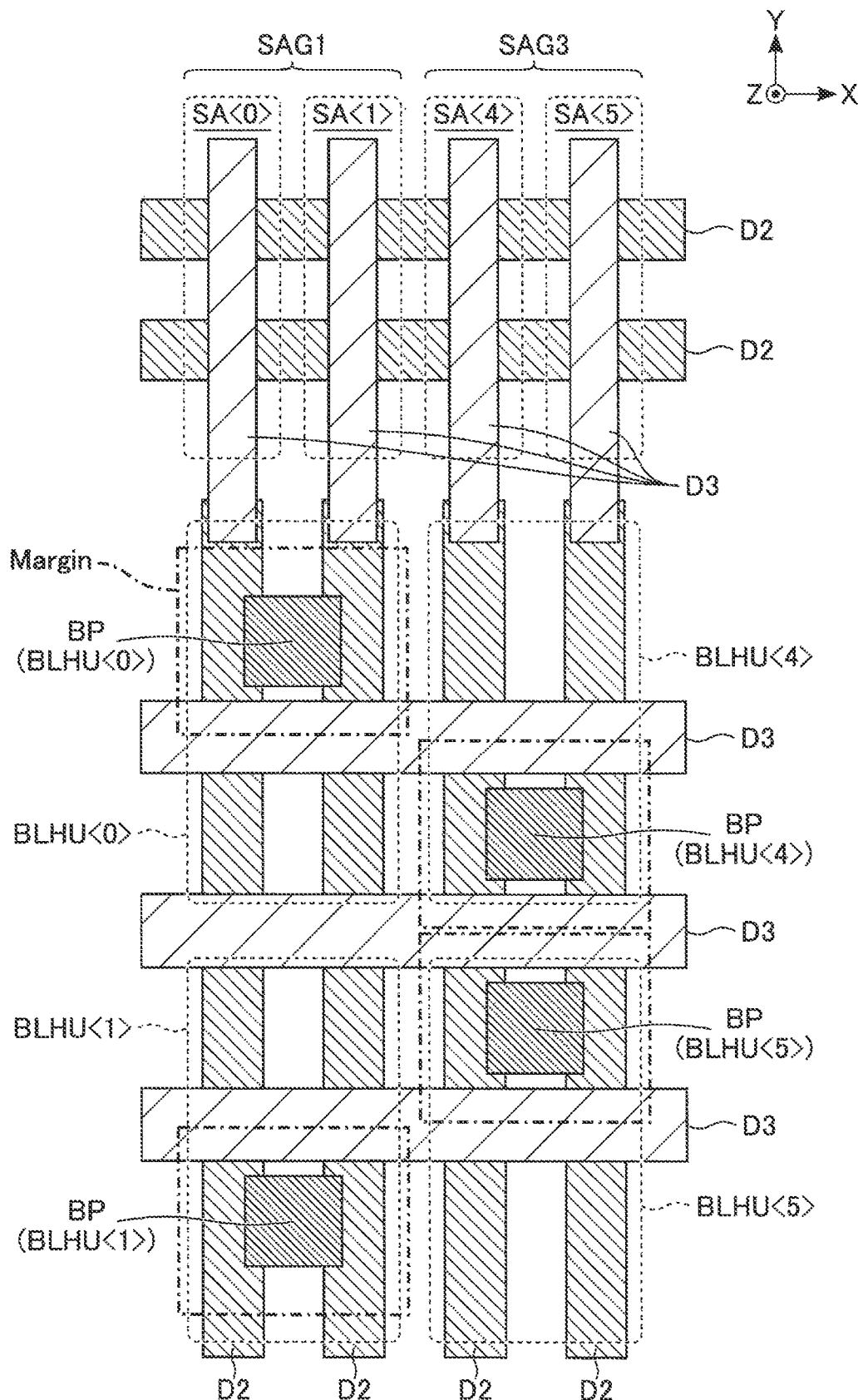
FIG. 14 is a plan view showing an example of a planar layout of the bonding pad and interconnect layers D2 and D3 in the sense amplifier region of the semiconductor memory device according to the first embodiment.

FIG. 14 shows an example of a planar layout of the bonding pad BP, and the interconnect layers D2 and D3 in the sense amplifier region SR of the semiconductor memory device 1 according to the first embodiment. The region shown in FIG. 14 is a region that overlaps FIG. 12, and the interconnect layers D2 and D3 that are illustrated correspond respectively to the arrangements of the conductive layers 64 and 65.

As shown in FIG. 14, the interconnect layer D2 includes a plurality of conductive layers 64 extended respectively in the X direction, and a plurality of conductive layers 64 extended respectively in the Y direction. The interconnect layers D3 include a plurality of conductive layers 65 extending respectively in the X direction, and a plurality of conductive layers 65 extending respectively in the Y direction.

In the region of the bit line coupling unit BLHU, for example, the conductive layer 64 extended in the Y direction inside the interconnect layer D2 and the conductive layer 65 extended in the X direction inside the interconnect layer D3 overlap. In the region of the sense amplifier SA, for example, the conductive layer 64 extended in the X direction inside the interconnect layer D2 and the conductive layer 65 extended in the Y direction inside the interconnect layer D3 overlap. In other words, in the region of the bit line coupling unit BLHU, for example, the interconnect (the conductive layer 64) is formed in a lengthwise direction in the interconnect layer D2, and the interconnect (the conductive layer 65) is formed in a crosswise direction in the interconnect layer D3. In the region of the sense amplifier SA, for example, an interconnect (the conductive layer 64) is formed in a lengthwise direction in the interconnect layer D2, and an interconnect (the conductive layer 65) is formed in a crosswise direction in the interconnect layer D3.

Furthermore, for example, an end portion of the conductive layer 64 that overlaps the region of the bit line coupling unit BLHU and extends in the Y direction inside the interconnect layer D2, and an end portion of the conductive layer 65 that overlaps the region of the sense amplifier SA and extends in the Y direction inside the interconnect layer D3 overlap. The end portion of the conductive layer 64 and the end portion of the conductive layer 65 are coupled by, for example, the contact C3. The conductive layer 65 inside the interconnect layer D3 that overlaps the region of the bit line coupling unit BLHU is arranged, for example, between adjacent bonding pads BP.

In the illustrated region, the interconnect in the crosswise direction inside the interconnect layer D2 is used as an interconnect of a control signal input to the transistor inside the sense amplifier SA, or as a power line. The interconnect in the lengthwise direction inside the interconnect layer D3 is used as an interconnect of a control signal input to the transistor inside the bit line coupling unit BLHU. The interconnect in the lengthwise direction inside the interconnect layer D3 that passes through the region of the sense amplifier SA is bypassed by, for example, the interconnect in the lengthwise direction inside the interconnect layer D2 passing through the region of the bit line coupling unit BLHU. In FIG. 14, the conductive layer 65 inside the interconnect layer D3 provided below the bonding pad BP inside the interconnect layer D4 is omitted. In the semiconductor memory device 1 according to the first embodiment, an interconnect (the conductive layer 65) that is coupled to the bonding pad BP is freely arranged in the interconnect layer D3.

Figure 15:
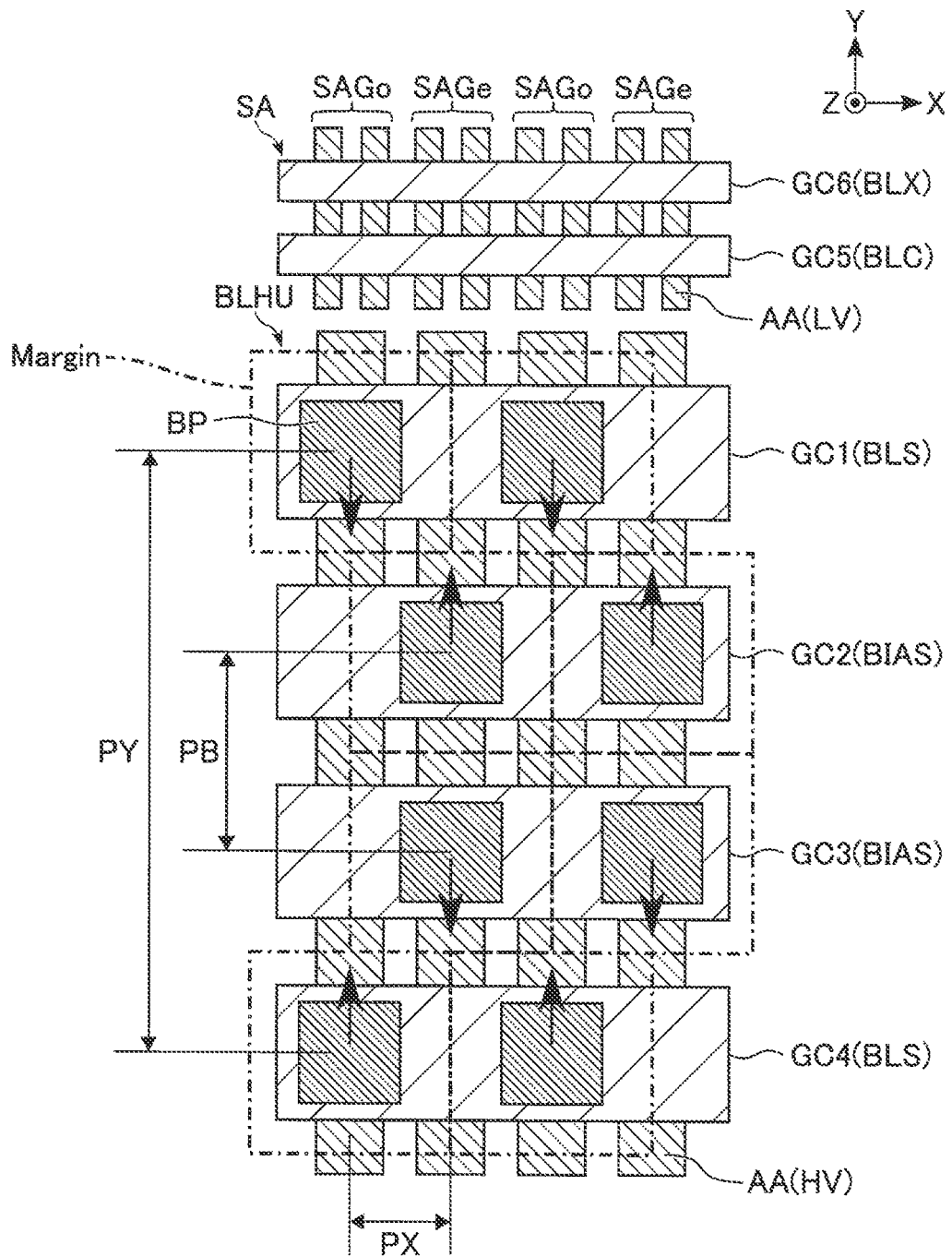
FIG. 15 is a plan view showing an example of a planar layout of the bonding pad, the active region, and the gate line in the sense amplifier region of the semiconductor memory device according to the first embodiment.

In the semiconductor memory device 1 according to the first embodiment explained above, the bonding pad BP may be arranged in the manner shown in FIG. 15. FIG. 15 shows an example of a planar layout of the bonding pad BP, the active region AA, and the gate line GC in the sense amplifier region SR of the semiconductor memory device 1 according to the first embodiment, and shows a broader region than that of FIG. 12. An arrow drawn out from the bonding pad BP in FIG. 15 indicates a position of the active region AA(HV) to be coupled. A sense amplifier group SAGo corresponds to an odd-numbered sense amplifier group SAG among a plurality of sense amplifier groups SAG aligned in the X direction, and a sense amplifier group SAGe corresponds to an even-numbered sense amplifier group SAG among a plurality of sense amplifier groups SAG aligned in the X direction.

As shown in FIG. 15, in the semiconductor memory device according to the first embodiment, a distance of the bonding pads BP included respectively in the adjacent sense amplifier groups SAG in the X direction is narrower than a width of the margin part of the bonding pad BP in the X direction.

Specifically, a pitch PX of the active regions AA(HV) aligned in the X direction is designed to be, for example, approximately half a pitch PB of the bonding pad BP. Furthermore, a pitch PY in the Y direction of gate lines GC1 and GC4 that correspond to the same sense amplifier group SAG, and to which the control signal BLS is input, is designed to approximately triple the pitch PB of the bonding pads BP that are adjacent in the X direction or the Y direction. In other words, the width of the active regions AA(HV) in the Y direction is designed to be at least four times the pitch PB of the bonding pads BP.

For example, the two bonding pads BP corresponding to one sense amplifier group SAGo are arranged on the corresponding active region AA(HV) and on both end portions in the Y direction. The two bonding pads BP corresponding to one sense amplifier group SAGe are arranged on the corresponding active region AA(HV) and in a manner interposed between the two bonding pads BP corresponding to the sense amplifier group SAGo. The shift of the four bonding pads BP in the adjacent sense amplifier groups SAGo and SAGe in the X direction may be designed as appropriate.

In the layout of the sense amplifier group SAG explained above, each of the bonding pads BP of the two adjacent sense amplifier groups SAGo is arranged adjacent to each other in the X direction, and each of the bonding pads BP of two adjacent sense amplifier groups SAGe is arranged adjacent to each other in the X direction. As a result, it becomes possible to align the four bonding pads BP in the adjacent sense amplifier groups SAGo and SAGe in the Y direction, which allows the bonding pads BP to be arranged more closely.

A part of the sense amplifier region SR may also be roughly classified into a first region that includes a plurality of active regions AA(HV) and a second region that includes a plurality of active regions AA(LV). For example, in FIG. 15, the first region includes first to fourth subregions, each of which is provided extending in the X direction. The first to fourth subregions are aligned in the Y direction, and include gate lines GC1 to GC4, respectively. In other words, the first subregion includes the transistor 30, which is coupled to the gate line GC1, and the second subregion includes the transistor 31, which is coupled to the gate line GC2. The third subregion includes the transistor 31, which is coupled to the gate line GC3. The fourth subregion includes the transistor 30, which is coupled to the gate line GC4. Each of the first to fourth subregions includes bonding pads BP aligned in the X direction. Each of the pitch of the bonding pads BP included in the first subregion in the X direction, the pitch of the bonding pads BP included in the second subregion in the X direction, the pitch of the bonding pads BP included in the third subregion in the X direction, and the pitch of the bonding pads BP included in the fourth subregion in the X direction is approximately twice the pitch of the transistor 30 coupled to the gate line GC1 or GC4 in the X direction.

[1-2] Erase Operation of Semiconductor Memory Device 1

Hereinafter, an erase operation of the semiconductor memory device 1 according to the first embodiment will be explained. In the following, a voltage to be applied to various interconnects will be described using reference symbols only where appropriate. A block BLK to be the target of the erase operation will be referred to as a selected block BLK, and a block BLK not to be the target of the erase operation will be referred to as a non-selected block BLK. A voltage to be applied to various interconnects and nodes is generated by, for example, the driver module 14, and is applied via the row decoder module 15, etc.

Figure 16:
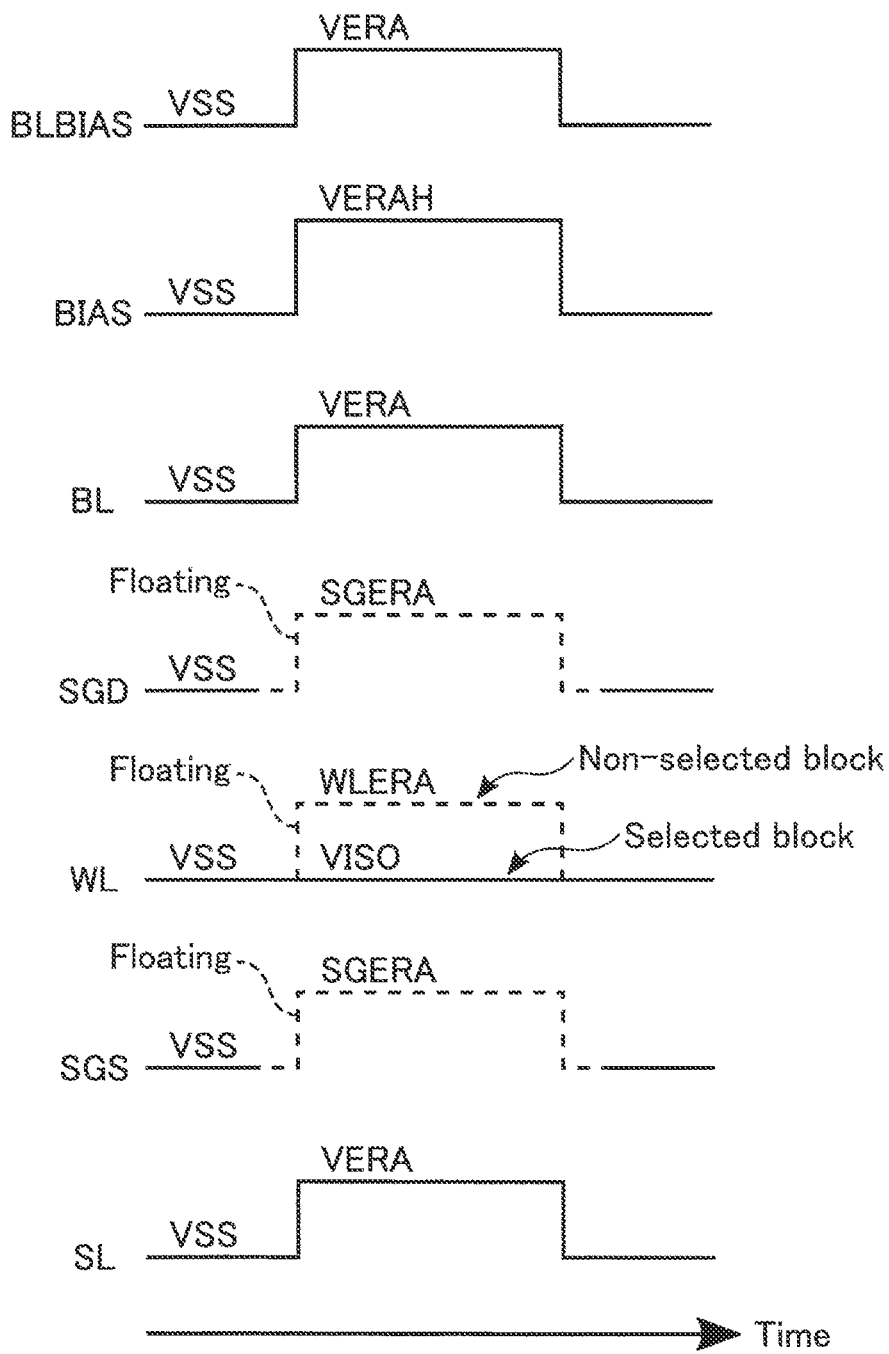
FIG. 16 is a timing chart showing an example of an erase operation of the semiconductor memory device according to the first embodiment.

FIG. 16 is a timing chart showing an example of the erase operation of the semiconductor memory device 1 according to the first embodiment. FIG. 16 shows an example of the voltage of each of the node BLBIAS, the control signal BIAS, the bit line BL, the select gate line SGD, the word line WL, the select gate line SGS, and the source line SL in the erase operation.

As shown in FIG. 16, the voltage of each of the node BLBIAS, the control signal BIAS, the bit line BL, the select gate line SGD, the word line WL, the select gate line SGS, and the source line SL before the erase operation is, for example, a ground voltage VSS. When the erase operation is started, the sequencer 13 turns off the transistor 30 to cut off a current path between the bit line BL and the sense amplifier SA, and subjects each of the select gate lines SGS and SGD and the word line WL corresponding to the non-selected block BLK to a floating state.

Subsequently, the sequencer 13 causes the voltage of each of the node BLBIAS and the source line SL to rise to an erase voltage VERA, causes the voltage of the control signal BIAS to rise to VERAH, and maintains the voltage of the word line WL in the selected block BLK at VISO. VERA is higher than VSS, and is a high voltage used for the erase operation. VERAH is a voltage higher than VERA. VISO is a voltage lower than VERA, and is, for example, the same voltage as VSS.

The transistor 31 receiving VERAH and VERA applied respectively to each of the gate and the drain is turned on, and the voltage of the node BLBIAS is transferred to the bit line BL. The voltage of the bit line BL then rises to VERA, and a high-field region is formed at the lower part of the memory pillar MP. Similarly, by the voltage of the source line SL rising to VERA, a high-field region is formed at the upper part of the memory pillar MP. As a result, a positive hole is generated by Gate-Induced Drain Leakage (GIDL) near each of the select transistors ST1 and ST2, and the positive hole is injected into a channel inside the memory pillar MP.

Furthermore, along with the rise in the voltages of the bit line BL and the source line SL to ERA, the voltage of the channel (the semiconductor layer 50) inside the memory pillar MP rises. In accordance with the rise in the voltage of the channel, the voltage of each of the select gate lines SGD and SGS and the word line WL corresponding to the non-selected block BLK rises. For example, the voltage of each of the select gate lines SGD and SGS rises to SGERA, and the voltage of the word line WL corresponding to the non-selected block BLK rises to WLERA. SGERA and WLERA may be different.

On the other hand, since the word line WL corresponding to the selected block BLK is maintained at voltage VISO, a voltage difference occurs between the control gate of the memory cell transistor MT and the channel. In other words, a voltage gradient is formed between the high channel voltage and the low word line WL voltage. Therefore, the positive hole in the channel is injected into the charge storage layer (the insulating film 52), and recombination occurs between an electron held in the charge storage layer and the injected positive hole.

As a result, the threshold voltage of the memory cell transistor MT decreases, and data stored in the memory cell transistor MT is erased. Subsequently, the sequencer 13 restores the voltage of the various interconnects to a state before starting the erase operation. In the manner explained above, the semiconductor memory device 1 according to the first embodiment can erase the data stored in the memory cell transistors MT.

[1-3] Advantage of First Embodiment

According to the semiconductor memory device 1 of the first embodiment described above, it is possible to reduce the chip area and suppress the manufacturing cost of the semiconductor memory device 1. Hereinafter, detailed advantages of the semiconductor memory device 1 according to the embodiment will be explained.

The semiconductor memory device may be roughly divided into a memory cell array and other peripheral circuits. In order to reduce the bit cost of the semiconductor memory device, it is preferable to increase the ratio (cell occupancy rate) of the chip area of the semiconductor memory device occupied by a region corresponding to the memory cell array.

In contrast, the semiconductor memory device 1 of the first embodiment comprises a memory chip MC that includes the memory cell array 10 and a CMOS chip CC that includes other peripheral circuits. The memory chip MC and the CMOS chip CC are each formed on different wafers. A semiconductor chip corresponding to the semiconductor memory device 1 is formed by bonding the memory chip MC and the CMOS chip CC together. Specifically, in the semiconductor memory device 1, by joining the bonding pads BP facing each other between the memory chip MC and the CMOS chip CC together, the upper and the lower chips are electrically coupled.

Therefore, the semiconductor memory device 1 of the first embodiment has a structure in which the memory cell array 10 and the peripheral circuits are stacked, thereby increasing the cell occupancy rate. As a result, in the semiconductor memory device 1 of the first embodiment, it is possible to reduce the chip area. Furthermore, in the semiconductor memory device 1 of the first embodiment, since the heat generated upon formation of the memory cell array 10 would not be applied to the transistor inside the CMOS chip CC, it is possible to reduce the difficulty of designing the transistor inside the CMOS chip CC.

In the semiconductor memory device 1 having the bonded structure explained above, the bonding pad BP coupled to the bit line BL on the memory chip MC side is electrically coupled to the bonding pad BP coupled to the sense amplifier module 16 on the CMOS chip CC side. Furthermore, since the bit line BL rises to a voltage corresponding to the erase voltage VERA when the erase operation is performed, the bit line BL is coupled to the sense amplifier SA via the high-breakdown-voltage transistor 30 included in the bit line coupling unit BLHU. When performing the erase operation, by turning off the transistor 30 inside the bit line coupling unit BLHU, the bit line BL and the sense amplifier SA are electrically insulated; therefore, the transistor inside the sense amplifier SA is protected from high voltage.

The active region AA(HV) corresponding to the bit line coupling unit BLHU is arranged adjacent to the active region AA(LV) corresponding to the sense amplifier SA. Furthermore, the arrangement of the bonding pad BP and the arrangement of the active region AA(HV) are determined based on the respective restraints thereof, and the associated bonding pad BP and transistor 30 are electrically coupled. Therefore, in some cases, the bonding pad BP may not overlap only the active region AA(HV), and may be arranged overlapping the other regions.

In the case where the bonding pad BP does not overlap only the active region AA(HV), it may overlap the power interconnect or the signal interconnect wired on the sense amplifier SA. In such case, it will be difficult to arrange the sense amplifier SA under the bonding pad BP. As a result, the distance between the active region AA(HV) corresponding to the bit line coupling unit BLHU and the active region AA(LV) corresponding to the sense amplifier SA may increase, thereby increasing the circuit area of the sense amplifier module 16, that is, increasing the chip area of the semiconductor memory device 1.

In contrast, in the semiconductor memory device 1 of the first embodiment, for example, the repeating pitch of the active region AA(HV) in the extending direction of the word line WL is designed to be approximately half the repeating pitch of the bonding pad BP. Furthermore, the repeating pitch of two gate lines GC, to which the control signal BLS is input, in the extending direction of the bit line BL is designed to approximately triple the repeating pitch of the bonding pad BP.

Therefore, in the semiconductor memory device 1 of the first embodiment, each bonding pad BP is arranged inside the bit line coupling unit BLHU, thereby preventing the bonding pad BP from overlapping the region of the sense amplifier SA. When the bonding pad BP is arranged on the active region AA(HV), that is, on a region of the bit line coupling unit BLHU, the region of the bonding pad BP becomes hidden by the region of the bit line coupling unit BLHU. In other words, depending on the arrangement of the bonding pad BP, the area of the sense amplifier module 16 can be prevented from increasing.

Furthermore, in the semiconductor memory device of the first embodiment, since it is possible to reduce the distance between the sense amplifier SA and the bit line coupling unit BLHU, it is also possible to reduce the interconnect resource. In addition, although the conductive layer 65 coupled to the bonding pad BP is formed inside the interconnect layer D3 and inside the region of the bit line coupling unit BLHU, by using the interconnect in the lengthwise direction inside the interconnect layer D2 for bypassing, it is also possible to form an interconnect that passes through the region of the bit line coupling unit BLHU.

In the manner mentioned above, in the semiconductor memory device 1 of the first embodiment, even in a case where the bonding pad BP is arranged to overlap the bit line coupling unit BLHU, the circuit inside the sense amplifier module 16 can be appropriately interconnected in an operable manner. As a result, in the semiconductor memory device 1 of the first embodiment, it is possible to reduce the chip area and suppress the manufacturing cost of the semiconductor memory device 1. [2] Second Embodiment A semiconductor memory device 1 according to a second embodiment is a modification of the first embodiment, and has a different configuration for a sense amplifier unit SAU. In the following, points in the semiconductor memory device 1 according to the second embodiment that are different from the first embodiment will be explained.

[2-1] Configuration of Semiconductor Memory Device 1

(Circuit Configuration of Sense Amplifier Module 16)

FIG. 17 shows an example of a circuit configuration of a sense amplifier unit SAU in a semiconductor memory device 1 according to the second embodiment. As shown in FIG. 17, the sense amplifier unit SAU in the second embodiment has a configuration in which the transistor 31 inside the bit line coupling unit BLHU is omitted from the sense amplifier unit SAU in the first embodiment. In other words, in the sense amplifier unit SAU in the second embodiment, only a transistor 30 to which a control signal BLS is input is coupled to an associated bit line BL. Since the other circuit configurations of the semiconductor memory device 1 according to the second embodiment are similar to those of the first embodiment, explanations thereof will be omitted.

(Structure in Sense Amplifier Region SR of Semiconductor Memory Device 1)

FIG. 18 shows an example of a detailed planar layout of a sense amplifier group SAG in the semiconductor memory device 1 according to the second embodiment. As shown in FIG. 18, in contrast to the sense amplifier group SAG in the first embodiment, the sense amplifier group SAG in the second embodiment has a structure in which an active region AA(HV) corresponding to a high-breakdown-voltage transistor is divided, and a gate line GC and a node N3 to which a control signal BIAS is input are omitted.

Specifically, two active regions AA(HV) are provided in a manner corresponding to bit line coupling units BLHU <0> and BLHU <1>, respectively. The active region AA(HV) corresponding to the bit line coupling unit BLHU <0> and the active region AA(HV) corresponding to the bit line coupling unit BLHU <1> are insulated by, for example, STI. The coupling relationship between Node N1, N2, and N4 to N11 shown in FIG. 18 is the same as that of the first embodiment.

Figure 19:
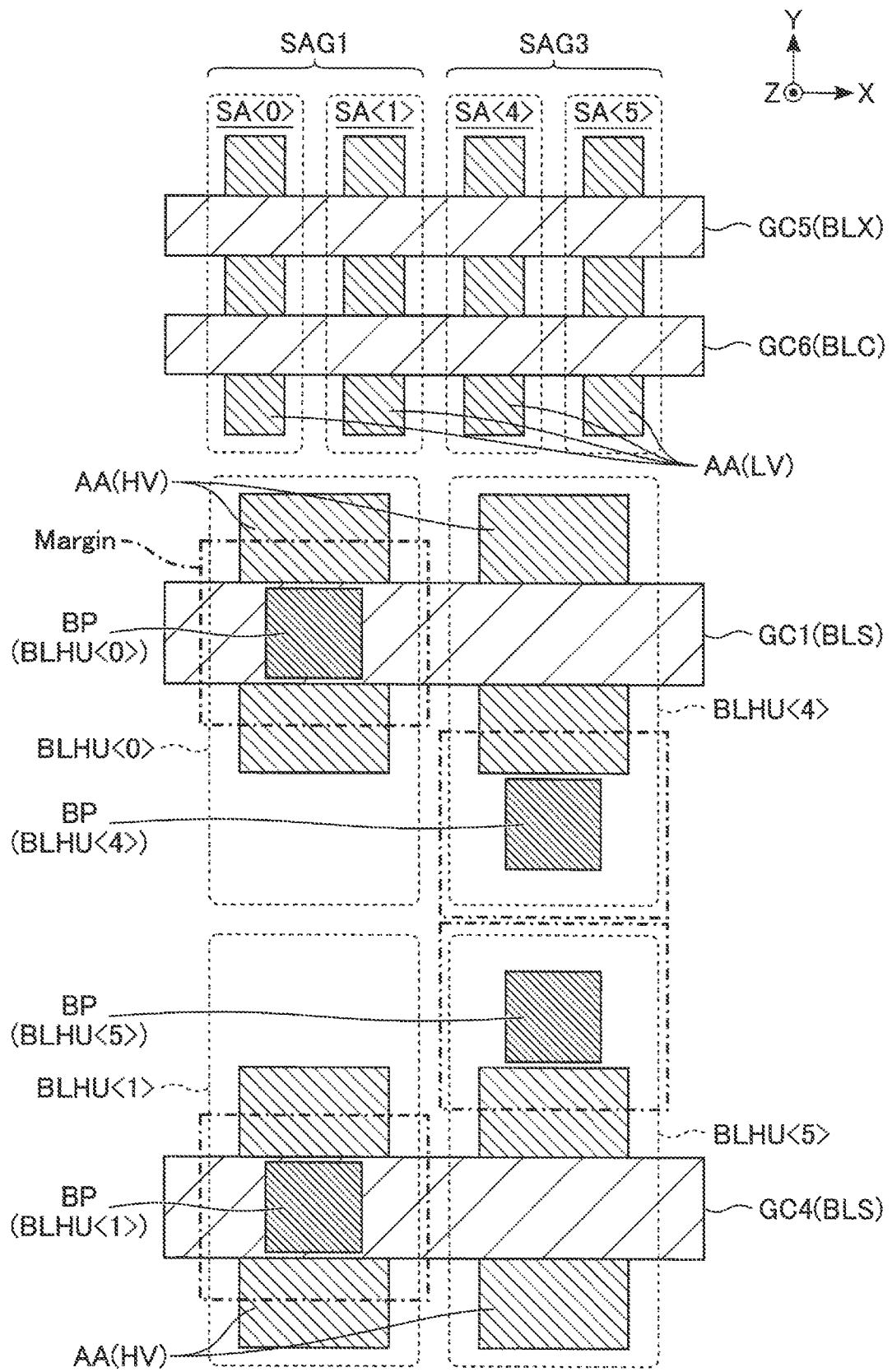
FIG. 19 is a plan view showing an example of a planar layout of a bonding pad in a sense amplifier region of the semiconductor memory device according to the second embodiment.

FIG. 17 is an example of a planar layout of a bonding pad BP, an active region AA, and a gate line GC in a sense amplifier region SR of the semiconductor memory device 1 according to the second embodiment, and shows the same region as that of FIG. 12 explained in the first embodiment. As shown in FIG. 19, the arrangement of the bonding pad BP in the second embodiment is, for example, the same as that of the first embodiment.

In brief, each of the bonding pads BP has a margin secured between adjacent bonding pads BP, and is arranged so as to overlap a region corresponding to an associated bit line coupling unit BLHU. The bonding pad BP corresponding to a bit line coupling unit BLHU <i> should at least overlap a region corresponding to the bit line coupling unit BLHU <i>. In the second embodiment, in some cases, the bonding pad BP may not overlap the active region AA(HV). Even in such case, the bonding pad BP at minimum only needs to be arranged near an associated active region AA(HV). Furthermore, the arrangement shown in FIG. 15 that is explained in the first embodiment may also be applied to the bonding pad BP inside the sense amplifier region SR in the second embodiment.

The arrangement of the bonding pad BP explained above is only an example; therefore, it is not limited thereto. For example, the arrangement of the bonding pad BP may be different from the first embodiment. For example, the bonding pads BP may be arranged closely by reducing the distance of the divided active regions AA(HV). Even in such a case, by devising the layout of the interconnects in the interconnect layers D0 to D3, the bonding pad BP and the sense amplifier unit SAU can be coupled. Since the other configurations of the semiconductor memory device 1 according to the second embodiment are similar to those of the first embodiment, explanations thereof will be omitted.

[2-2] Erase Operation of Semiconductor Memory Device 1

Figure 20:
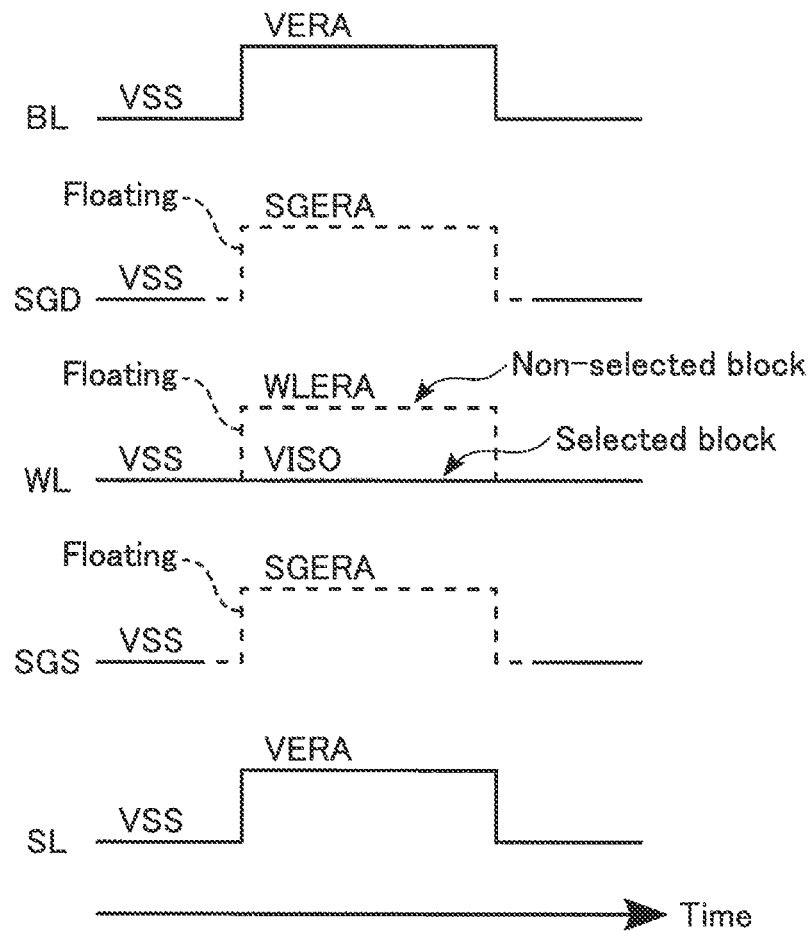
FIG. 20 is a timing chart showing an example of an erase operation of the semiconductor memory device according to the second embodiment.

FIG. 20 is a timing chart showing an example of an erase operation of the semiconductor memory device 1 according to the second embodiment. FIG. 20 shows an example of a voltage of each of the bit line BL, a select gate line SGD, a word line WL, a select gate line SGS, and a source line SL in the erase operation. As shown in FIG. 20, the timing chart of the erase operation in the second embodiment is the same as that of the first embodiment, except that operations relating to the node BLBIAS and the control signal BIAS are omitted from the timing of the erase operation explained in first embodiment.

In brief, when the erase operation is started, a sequencer 13 subjects each of select gate lines SGS and SGD and a word line WL corresponding to a non-selected block BLK to a floating state. Subsequently, the sequencer 13 causes the voltage of the source line SL to rise to an erase voltage VERA, and maintains the voltage of the word line WL in a selected block BLK at voltage VISO.

As a result, a high-field region is formed at the upper part of a memory pillar MP, a positive hole is generated by GIDL near a select transistor ST2, and the positive hole is injected into a channel inside the memory pillar MP. Furthermore, along with the rise in the voltages of the bit line BL and the source line SL to ERA, the voltage of the channel (a semiconductor layer 50) inside the memory pillar MP and the voltage of the bit line BL rise, respectively. In accordance with the rise in the voltage of the channel, the voltage of each of the select gate lines SGD and SGS and the word line WL corresponding to the non-selected block BLK rises.

On the other hand, since the word line WL corresponding to the selected block BLK is maintained at voltage VISO, a voltage difference occurs between a control gate of a memory cell transistor MT and the channel. Therefore, the positive hole in the channel is injected into the charge storage layer (the insulating film 52), and recombination occurs between an electron held in the charge storage layer and the injected positive hole.

As a result, a threshold voltage of the memory cell transistor MT decreases, and data stored in the memory cell transistor MT is erased. Subsequently, the sequencer 13 restores the voltage of the various interconnects to a state before starting the erase operation. In the manner explained above, the semiconductor memory device 1 according to the second embodiment can erase the data stored in the memory cell transistors MT.

[2-3] Advantage of Second Embodiment

In the same manner as the first embodiment, in the semiconductor memory device 1 of the second embodiment described above, an area of the sense amplifier region SR can be suppressed and a chip area of a CMOS chip CC can be suppressed. As a result, in the same manner as the first embodiment, in the semiconductor memory device 1 of the second embodiment, it is possible to suppress the chip area of the entire semiconductor memory device 1 and suppress the manufacturing cost of the semiconductor memory device 1.

[3] Third Embodiment

A semiconductor memory device 1 according to a third embodiment has a configuration similar to that of the first embodiment. In the semiconductor memory device 1 of the third embodiment, a planar layout of a sense amplifier region SR differs from the first embodiment. In the following, points in the semiconductor memory device 1 of the third embodiment that are different from the first embodiment will be explained.

[3-1] Regarding Planar Layout of Sense Amplifier Region SR

FIG. 21 shows an example of a planar layout in the sense amplifier region SR of the semiconductor memory device 1 according to the third embodiment. As shown in FIG. 21, in the sense amplifier region SR of the semiconductor memory device 1 according to the third embodiment, a length of a sense amplifier in an X direction is designed based on a length in which 16 bit lines BL can be formed in the X direction. In other words, the length of a sense amplifier SA in the X direction is designed based on a pitch (16 BLs pitch) in which 16 bit lines BL are formed.

Furthermore, a set of 16 sense amplifiers SA aligned in the Y direction is aligned in the X direction. Specifically, sense amplifiers <0> to <15> are aligned in the Y direction. Sense amplifier <16> is arranged adjacent to the sense amplifier <0>, sense amplifier <17> is arranged adjacent to the sense amplifier <1>, . . . and sense amplifier <31> is arranged adjacent to the sense amplifier <15>. A plurality of sense amplifiers SA are arranged in the same manner thereafter.

Furthermore, a bit line coupling unit BLHU is arranged between each of, for example, sense amplifiers <0> and <1>, sense amplifiers <2> and <3>, sense amplifiers <4> and <5>, sense amplifiers <6> and <7>, sense amplifiers <8> and <9>, sense amplifiers <10> and <11>, sense amplifiers <12> and <13>, and sense amplifiers <14> and <15>. Each of the bit line coupling units BLHU is used to couple, for example, adjacent sense amplifiers SA and bit lines BL associated to such sense amplifiers SA. The other sense amplifiers SA are also adjacent to the bit line coupling unit BLHU in the same manner as the sense amplifiers SA<0> to <15>.

The arrangement of the sense amplifier SA and the bit line coupling unit BLHU explained above is only an example. For example, the number of sense amplifiers SA aligned in the Y direction in the sense amplifier region SR can be designed as any number. In the same manner as the first embodiment, the bit line coupling units BLHU may or may not be adjacent to the sense amplifiers SA. For example, the set of the sense amplifiers <0> and <1> and the bit line coupling unit BLHU between the sense amplifiers <0> and <1> in FIG. 21 may be replaced with the set of sense amplifier groups SAG1 and SAG2 explained in the first embodiment. A latch circuit inside a sense amplifier unit SAU is arranged, for example, outside the region shown in FIG. 21.

[3-2] Advantage of Third Embodiment

As explained above, in a structure where the memory chip MC and the CMOS chip CC are bonded together, the bit line coupling unit BLHU may be arranged in a distributed manner. Therefore, the flexibility of the layout of the bit line coupling unit BLHU is higher than a structure in which the memory cell array 10 and the sense amplifier module 16 are formed on a common semiconductor substrate. As a result, in the semiconductor memory device 1 according to the third embodiment, the number of internal interconnects from the bit line coupling unit BLHU to each of the sense amplifiers SA can be reduced, and the length of the internal interconnect can be made shorter. The third embodiment may be combined with either one of the first embodiment and the second embodiment.

[4] Other Modifications, etc.

A semiconductor memory device of an embodiment includes a memory chip <for example, symbol MC in FIG. 5> and a circuit chip <for example, symbol CC in FIG. 5>. The memory chip includes first and second memory cells, first and second bit lines electrically coupled to one end of each of the first and the second memory cells, respectively, and first and second joint metals <for example, symbol 47 (BP) in FIG. 11> electrically coupled to the first and second bit lines, respectively. The circuit chip includes a substrate, first and second sense amplifiers <for example, symbol SAU in FIG. 3> provided on the substrate, and third and fourth joint metals <for example, symbol 66(BP) in FIG. 11> electrically coupled to the first and second sense amplifiers, respectively, and facing the first and second joint metals, respectively. The circuit chip and the memory chip are joined. The first and second joint metals are electrically coupled to the third and fourth joint metals, respectively. The first sense amplifier <for example, a pair of symbols SA<0> and BLHU <0> in FIG. 10> includes a first active region and a second active region which is different from the first active region. The first active region is provided with a first transistor <for example, symbol 30 in FIG. 10> that is electrically coupled between the third joint metal and the second active region. The second amplifier <for example, a pair of symbols SA<1> and BLHU <1> in FIG. 10> includes a third active region that is adjacent to the first active region in a first direction, a fourth active region that is adjacent to the second active region in a second direction intersecting with the first direction, and that differs from the third active region. The third active region is provided with a second transistor <for example, symbol 30 in FIG. 10> that is electrically coupled between the fourth joint metal and the fourth active region. In a planar view, the third and fourth joint metals overlap the first and third active regions, respec- tively <for example, symbol BP in FIG. 12>. This allows a chip area of the semiconductor memory device to be reduced.

In the above embodiment, a case in which a positive hole that is generated by a GIDL is used in an erase operation is exemplified; however, the GIDL does not have to be used in the erase operation. In the case where the GIDL is not used in the erase operation, for example, an upper part of a memory pillar MP, that is, a source line SL, is provided with a region in which p-type impurities are diffused, and a positive hole is supplied into the memory pillar MP from such a region.

In the above embodiment, a case in which interconnect layers M0 to M2 are provided on the memory chip MC, and interconnect layers D0 to D4 are provided on the CMOS chip CC is exemplified; however, the present invention is not limited thereto. The number of interconnect layers to be provided on each of the memory chip MC and the CMOS chip CC can be changed as appropriate in accordance with the design of the circuit.

In the above embodiment, a plurality of contacts V1 may be coupled in parallel between the facing interconnect layers 46 and 47. Similarly, a plurality of contacts C4 may be coupled in parallel between the facing interconnect layers 65 and 66. In the above manner, by coupling a bonding pad BP (a conductive layer 47 or 66) and a conductive layer provided in an interconnect layer adjacent to the bonding pad BP by a plurality of contacts, a stress on contacts V1 and C4 that occurs when joining the memory chip MC and the CMOS chip CC together can be distributed.

In the above embodiment, a contact CV between the memory pillar MP and the conductive layer 45 may be configured by two or more contacts connected in the Z direction. In the case where the contact CV has a structure in which a plurality of contacts are connected, a different conductive layer may be inserted between the adjacent contacts.

In the above embodiment, a case in which a structure between two adjacent slits SLT corresponds to one string unit SU is exemplified; however, the invention is not limited thereto. For example, by providing a slit that divides a select gate line SGD between two adjacent slits SLT, a plurality of string units SU may be formed between the two adjacent slits SLT. The number of string units SU between the adjacent slits SLT varies based on the number of slits dividing the select gate line SGD.

In the above embodiment, the memory pillar MP may have a structure in which two or more pillars are connected in the Z direction. Alternatively, the memory pillar MP may have a structure in which a pillar corresponding to the select gate line SGD and a pillar corresponding to a word line WL are connected. The number of bit lines BL overlapping each memory pillar MP may be designed as any number.

In the drawings used for the explanation of the above embodiment, a case in which the memory pillars MP have the same diameter in the Z direction is exemplified; however, the invention is not limited thereto. For example, the memory pillar MP may be tapered or reverse tapered, or may be bulged in the middle. Similarly, the slit SLT and the contacts CV, V0, V1, CS, and C0 to C4, etc. may also be tapered or reverse tapered, or may be bulged in the middle.

In the above embodiment, a case in which the cross-sectional structure of the memory pillar MP is circular is exemplified; however, the invention is not limited thereto. For example, the cross-sectional structure of the memory pillar MP may be oval, or may be designed to have any other shape. Although a case in which the planar shape of the bonding pad BP is square is explained, the bonding pad BP may also have rounded corners. Furthermore, the planar shape of the bonding pad BP may be circular or oval, or may be designed to have any other shape.

The structure in the sense amplifier region SR of the semiconductor memory device 1 explained in the above embodiment may also be applied to other semiconductor memories. For example, the memory cell transistor MT provided in the memory region MR may be a phase change memory cell, or may be a memory cell using ferroelectric thin film materials.

Herein, the term "couple" refers to electrical coupling, and does not exclude, for example, coupling performed via another component interposed therebetween. The expression "electrically coupled" may include coupling via an insulator as long as such coupling can perform the same operation as being electrically coupled. The term "pillar" refers to a structure provided in a hole formed in the process of manufacturing the semiconductor memory device 1. The term "pitch" corresponds to an interval at which a plurality of structural elements aligned in a certain direction are arranged. The "pitch" may be measured with reference to a center line of the structural element, and may have any other measuring (or calculating) method adopted as long as it is measured based on the same reference. The "bonding pad BP" may also be referred to as a joint metal. The term "planar view" indicates a planar layout of the semiconductor memory device 1 observed from, for example, a vertical direction with respect to the surface of a p-type well region 60.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate including a first region and a second region;
a plurality of first transistors provided in the first region;
a plurality of second transistors provided in the second region, the plurality of second transistors being electrically coupled to the plurality of first transistors, respectively, and a breakdown-voltage of the second transistors being lower than a breakdown-voltage of the first transistors;
a plurality of joint metals provided above the first region, the plurality of joint metals being electrically coupled to the plurality of first transistors, respectively;
a plurality of bit lines provided in an upper layer with respect to the plurality of joint metals, the plurality of bit lines being coupled to the plurality of joint metals, respectively; and
a plurality of memory cells provided in an upper layer with respect to the plurality of bit lines, the plurality of memory cells being coupled to the plurality of bit lines, respectively,
wherein the first transistors and the plurality of joint metals overlap in a planar view, and a pitch of the plurality of joint metals in a first direction approximately doubles a pitch of a first transistor in the first direction.

2. The device of claim 1, wherein:
the first region includes first to fourth subregions, each of the first to fourth subregions extending in the first direction,
the first to fourth subregions are aligned in a second direction that intersects the first direction,
the plurality of joint metals include a plurality of first joint metals included in the first subregion, a plurality of second joint metals included in the second subregion, a plurality of third joint metals included in the third subregion, and a plurality of fourth joint metals included in the fourth subregion,
the plurality of first transistors are classified into a first group and a second group, a part of a first transistor of the first group being included in the first subregion, and a part of a first transistor of the second group being included in the fourth subregion, and
each of a pitch of the plurality of first joint metals in the first direction, a pitch of the plurality of second joint metals in the first direction, a pitch of the plurality of third joint metals in the first direction, and a pitch of the plurality of fourth joint metals in the first direction approximately doubles a pitch of a first transistor in the first group or the second group in the first direction.

3. The device of claim 1, further comprising:
a plurality of sense amplifiers, each of the plurality of sense amplifiers including the first transistor and the second transistor,
wherein each of the plurality of joint metals includes copper.

4. The device of claim 2, wherein of the plurality of first transistors, a plurality of first transistors included in the first group are respectively adjacent to a plurality of first transistors included in the second group.

5. The device of claim 2, wherein:
the first region includes a plurality of active regions, each of the active regions extending in the second direction, and
each of the active regions includes each of the first transistor in the first group and the first transistor in the second group.

6. The device of claim 5, further comprising:
a first gate electrode extending in the first direction in the first subregion and used as a gate electrode of the plurality of first transistors included in the first group; and
a second gate electrode extending in the first direction in the fourth subregion and used as a gate electrode of the plurality of first transistors included in the second group.

7. The device of claim 6, further comprising:
a plurality of third transistors provided in the second subregion; and
a plurality of fourth transistors provided in the third subregion,
wherein each of the active regions includes the third transistor and the fourth transistor.

8. The device of claim 7, further comprising:
a third gate electrode extending in the first direction in the second subregion and used as a gate electrode of the plurality of third transistors; and
a fourth gate electrode extending in the first direction in the third subregion and used as a gate electrode of the plurality of fourth transistors.

9. The device of claim 7, wherein of the plurality of active regions, the first transistor, the third transistor, the fourth transistor, and the second transistor, all of which are included in a same active region, are coupled in series in this order.

10. The device of claim 9, wherein:
the plurality of bit lines include a first bit line and a second bit line,
the first bit line is coupled to a node between the first transistor and the third transistor, which are both included in a same active region, and
the second bit line is coupled to a node between the fourth transistor and the second transistor, which are both included in a first active region.

11. The device of claim 5, wherein:
the plurality of active regions include an odd-numbered active region group composed of a plurality of odd-numbered active regions aligned in the first direction, and an even-numbered active region group composed of a plurality of even-numbered active regions aligned in the first direction, and
in the planar view, each of the plurality of first joint metals and the plurality of fourth joint metals overlaps the odd-numbered active region group, and each of the plurality of second joint metals and the plurality of third joint metals overlaps the even-numbered active region group.

12. The device of claim 11, wherein each of the plurality of active regions includes a first active region and a second active region which are aligned in the second direction and are insulated from each other, the first active region including the first transistor, and the second active region including the second transistor.

13. The device of claim 1, wherein:
the first transistor comprises a bias transistor that is connected to a first bit line of the plurality of bit lines and a first node, and
the bias transistor turns on and an erase voltage is applied to the first bit line through the first node when an erase operation is executed.

* * * * *